United States Patent
Suess et al.

(10) Patent No.: US 9,165,972 B2
(45) Date of Patent: Oct. 20, 2015

(54) SEMICONDUCTOR STRUCTURE, METHOD OF OPERATING SAME, AND PRODUCTION METHOD

(71) Applicant: Fraunhofer-Gesellschaft zur Foerderung der angewandten Forschung e.V., Munich (DE)

(72) Inventors: Andreas Suess, Duesseldorf (DE); Werner Brockherde, Duisburg (DE); Bedrich Hosticka, Muelheim a.d.Ruhr (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 13/827,899

(22) Filed: Mar. 14, 2013

(65) Prior Publication Data
US 2013/0270610 A1    Oct. 17, 2013

(30) Foreign Application Priority Data

Mar. 15, 2012 (EP) .................................... 12159762
Apr. 13, 2012 (DE) ........................ 10 2012 206 089

(51) Int. Cl.
*H01L 27/146*    (2006.01)

(52) U.S. Cl.
CPC ...... *H01L 27/14643* (2013.01); *H01L 27/1463* (2013.01); *H01L 27/14607* (2013.01); *H01L 27/14612* (2013.01); *H01L 27/14645* (2013.01)

(58) Field of Classification Search
CPC ..................... H01L 21/823406; H01L 27/146; H01L 27/14609; H01L 27/14643; H01L 27/14601; H01L 27/14612; H01L 27/14645; H01L 27/14679; H01L 27/148; H01L 27/14893; H01L 27/14607; H01L 27/1463

USPC ................. 257/219, 225, 239, 240, 241, 246, 257/E27.082–E27.083, E27.15–E27.163, 257/E29.065, E29.227–E29.24
See application file for complete search history.

(56) References Cited

U.S. PATENT DOCUMENTS 4,074,302 A    2/1978 Brewer
4,984,045 A    1/1991 Matsunaga et al.
(Continued)

FOREIGN PATENT DOCUMENTS

JP    2006-049508    *  2/2006

OTHER PUBLICATIONS

Brewer, R.J. , "A Low Noise CCD Output Amplifier", Philips Research Laboratories. Redhill, Surrey, England., 610-612.
(Continued)

*Primary Examiner* — Jae Lee
*Assistant Examiner* — Mohammed R Alam
(74) *Attorney, Agent, or Firm* — Michael A. Glenn; Perkins Coie LLP

(57) ABSTRACT

A semiconductor structure includes a semiconductor layer of a first conductivity type, a photosensitive zone configured such that photogenerated charges may be accumulated in a first potential well, a region of the first conductivity type, formed in the semiconductor layer, for temporarily storing the photogenerated charges in a second potential well, a transfer gate between the region of the second conductivity type and the photosensitive zone for defining a potential barrier between the first and second potential wells during a non-transfer phase, and for eliminating the potential barrier between the first and second potential wells during a transfer phase, and a readout structure for reading out the temporarily stored photogenerated charges, which includes a JFET, the gate of which is formed by the region of the second conductivity type.

18 Claims, 22 Drawing Sheets

(56) References Cited

U.S. PATENT DOCUMENTS

| | | | |
|---|---|---|---|
| 5,060,070 A | 10/1991 | Nishida et al. | |
| 5,229,630 A | 7/1993 | Hamasaki et al. | |
| 5,357,128 A | 10/1994 | Shinji et al. | |
| 5,464,997 A | 11/1995 | Watanabe et al. | |
| 5,712,498 A | 1/1998 | Reich et al. | |
| 5,739,562 A * | 4/1998 | Ackland et al. | 257/291 |
| 6,046,466 A | 4/2000 | Ishida et al. | |
| 2001/0000068 A1 | 3/2001 | Isogai et al. | |
| 2005/0156264 A1 | 7/2005 | Sakano et al. | |
| 2005/0194655 A1 | 9/2005 | Sakano et al. | |
| 2007/0108476 A1* | 5/2007 | Hong | 257/225 |
| 2008/0079032 A1* | 4/2008 | Swain et al. | 257/228 |
| 2008/0283886 A1* | 11/2008 | Hynecek | 257/292 |

OTHER PUBLICATIONS

Brewer, R.J., "The Low Light Level Potential of a CCD Imaging Array", IEEE Transactions on Electron Devices. vol. ED-27, No. 2., Feb. 1980, 401-405.

Chen, Y et al., "A CMOS Image Sensor with In-Pixel Buried-Channel Source Follower and Optimized Row Selector", IEEE Transactions on Electron Devices. vol. 56, No. 11., Nov. 2009, 2390-2397.

Kim, J et al., "Characterization and Improvement of Random Noise in 1/3.2" UXGA CMOS Image Sensor with 2.8um-Tecnology", Image Solution, System LSI Division, Samsung Electronics Co., 149-152.

Lahav, A et al., "Optimization of Random Telegraph Noise Non Uniformity in a CMOS Pixel With a Pinned-Photodiode", 230-233.

Martin-Gonthier, P et al., "Custom Transistor Layout Design Techniques for Random Telegraph Signal Noise Reduction in CMOS Image Sensor", Electronics Letters. vol. 46, No. 19., Sep. 16, 2010, 2 Pages.

Martin-Gonthier, P et al., "Novel Readout Circuit Architecture for CMOS Image Sensors Minimizing RTS Noise", IEEE Electron Device Letters. vol. 32, No. 6., Jun. 2011, 776-778.

Matsunaga, Y et al., "A High Sensitivity Output Amplifier for CCD Image Sensors", IEEE. IEDM 87., 1987, 116-119.

McWorther, A.L., "1/f Noise and Related Surface Effects in Germanium", Doctoral Dissertation. University of Illinois., Jun. 1955, 119 Pages.

Roks, E et al., "A Bipolar Floating Base Detector (FBD) for CCD Image Sensors", iEEE., 1992, 4 Pages.

Roks, E et al., "The Double-Sided Floating-Surface Detector: an Enhanced Charge-Detection Architecture for CCD Image Sensors", IEEE Transactions on Electron Devices. vol. 43, No. 9., Nov. 1996, 1583-1591.

Schemmert, W et al., "Conductance of Ion-Implanted Buried-Channel MOS Transistors", IEEE Transactions on Electron Devices. vol. ED-23, No. 12., Dec. 1976, 1313-1319.

Theuwissen, A.J., "Solid-State Imaging with Charge-Coupled Devices", Kluwer Academic Publishers. Dordrecht. Boston. London., 2002, 39 Pages.

Wang, X et al., "A CMOS Image Sensor with a Buried-Channel Source Follower", IEEE. International Solid-State Circuits Conference., 2008, 3 Pages.

Wang, X et al., "Random Telegraph Signal in CMOS Image Sensor Pixels", Delft University of Technology. Delft, The Netherlands., 4 Pages.

Yamashita, H et al., "A New High Sensitivity Photo-Transistor for Area Image Sensors", IEEE. IEDM 88., 1988, 78-81.

\* cited by examiner

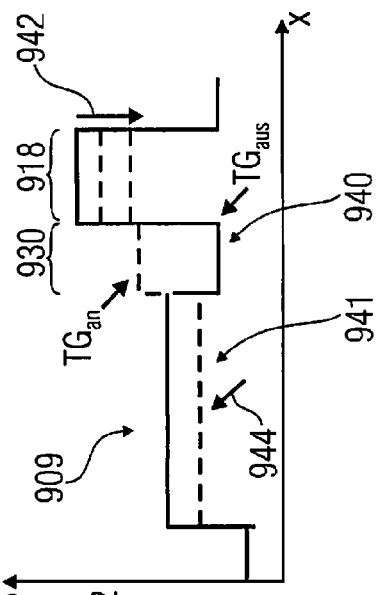
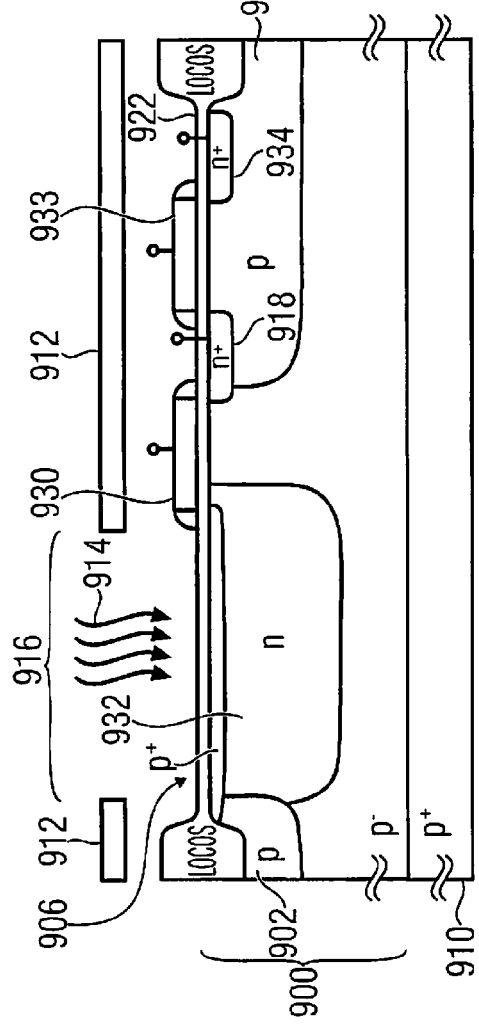
FIGURE 3B
FIGURE 3A

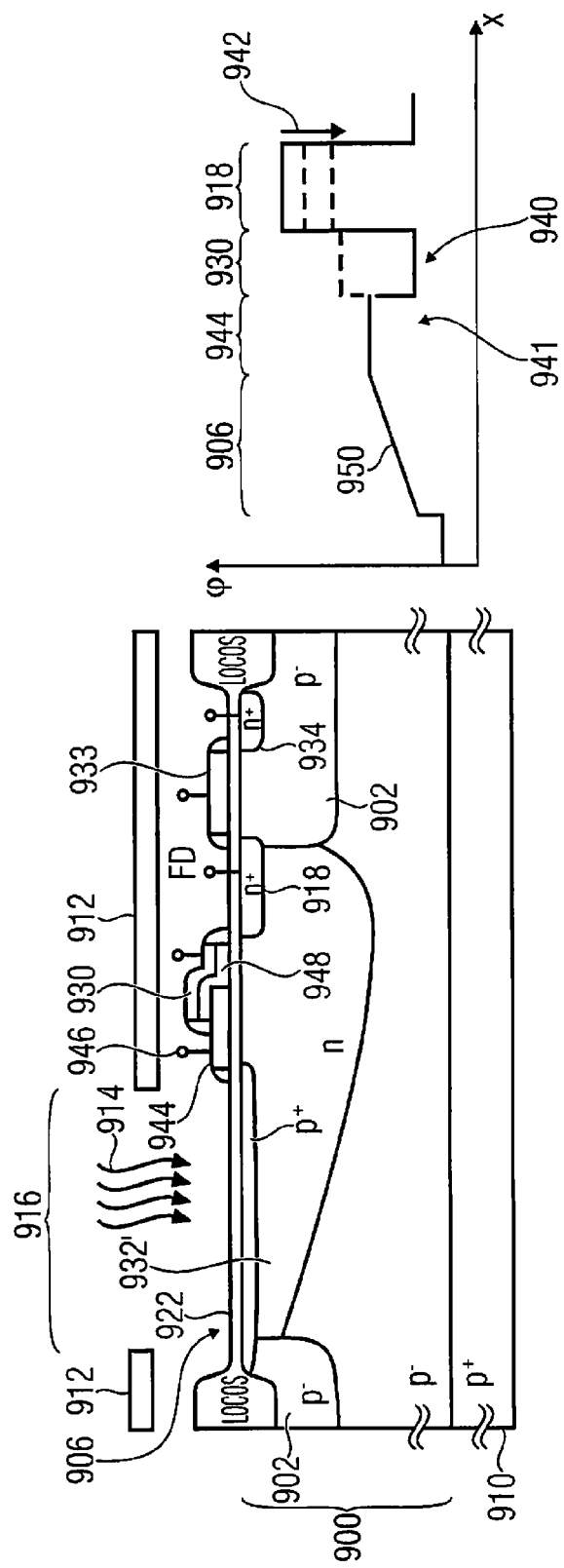

OUTPUT CHARACTERISTIC

TRANSFER CHARACTERISTIC

SEMICONDUCTOR STRUCTURE, METHOD OF OPERATING SAME, AND PRODUCTION METHOD

CROSS-REFERENCE TO RELATED APPLICATIONS

This application claims priority from German Patent Application No. 102012206089.8, which was filed on Apr. 13, 2012, and from European Patent Application No. 12159762.9, which was filed on Mar. 15, 2012, both of which are incorporated herein in their entirety by reference.

BACKGROUND OF THE INVENTION

The present invention relates to a semiconductor structure having a photosensitive zone and transfer gate and an area for temporarily storing (latching, or buffering) photogenerated charges in a potential well upon transfer across the transfer gate, as well as to a method of operating such a semiconductor structure, and to a production method.

Electrooptical image sensors have globally taken up a considerable market share. They enrich people's lives in many aspects. Markets where such sensors are applied are, for example, photography, medical technology, the automotive industry, scientific sensor systems, broadcasting, safety/security/machine vision or the consumer market.

Generally, CMOS image sensors have a dominant market share as compared to CCD sensors. This is essentially due to applications in the consumer market, where low-cost CMOS image sensors are used, among other things, for handhelds, notebooks or mobile radio devices. Those CMOS sensors which serve this market often benefit from the high integration density. The latter may be achieved in CMOS both for signal-pickup detectors and for the evaluating electronics. An additional advantage over CCD sensors is that the detectors (pixels) and the electronics, which may be very complex if need be, can be implemented on a semiconductor chip, which results in low-cost camera systems.

The market for image sensors for industrial or scientific applications with CCD sensors is more pronounced in relation to the consumer market. It is said that said market often has a lower intrinsic uncertainty and/or lower inherent noise and, thus, a larger dynamic range as compared to CMOS sensors. It is therefore mandatory for competitive CMOS products to produce sensors having as large dynamic ranges as possible while not using any or using as few expensive process variations as possible.

In addition, sensors for such applications are often not subject the harsh restrictions regarding increasing miniaturization, which in most cases are tied to enormous investments in process technology. This includes, e.g., sensors for spectroscopy, distance measurement or X-ray detection, which in many cases involve large photoactive areas so that signals can be detected even at low irradiance. Low-noise CMOS sensors, which may be produced without any expensive process modifications, in combination with the flexibility offered by CMOS as compared to CCD thus have a large market potential.

Applications for the proposed low-noise semiconductor structure for converting photogenerated charge are, for example:
  inspection/positioning systems
  automotive imaging systems:
    surveillance inside a vehicle
    airbag controlling systems
    vehicle safety
    road-line recognition
    pre-crash sensors
    pedestrian protection
    self-parking systems
  topographical applications
  general surveillance systems
  medical imaging
  scientific imaging applications
  video games and entertainment Noise reduction of sensors based on CMOS imagers is an essential problem that needs solving in order to provide products that can compete with CCD technology. The dominant readout structure for CCD imagers and CMOS imagers based on pinned photodiodes or the like is "floating diffusion" (FD). The readout principle based on an FD is restricted, in terms of noise performance, by the so-called reset noise. Said reset noise describes the inaccuracy of the reset level which is achieved when the storage capacity is being charged. On the basis of the so-called Correlated Double Sampling Method (CDS), it has been possible to improve the signal-to-noise ratio of such sensors substantially. In this context, two sampling operations are performed in as timely a manner as possible; at one point, only the reset value is sampled, and at another point, the subsequently detected signal level is sampled. Upon subsequent subtraction of these values, the inaccuracy is ideally eliminated since in the event of an obvious correlation, it is similarly inherent to the reset value as it is to the signal value (Solid-State Imaging with Charge-Coupled Devices, A. J. Theuwissen, ISBN-10: 9048145430, 2010). Analyses show that upon elimination of the reset noise, the uncertainty of the readout is often dominated by the source follower, which is mostly used as a readout circuit (Characterization and improvement of random noise in ⅓.2" UXGA CMOS image sensor with 2.8 μm pixel using 0.13 μm-technology, J. Y. Kom et al., Proc. IEEE Workshop on Charge-Coupled Devices and Advanced Image Sensors, 2005). The uncertainty of this source follower is often described, by way of example, by thermal noise, excess noise and random telegraph signal (RTS) noise, the two latter processes typically being dominant. Since CDS stages exhibit a filter characteristic, the noise sources of the source follower may partly be reduced by suitably dimensioning said filter characteristic. RTS noise, however, cannot be fully eliminated by a CDS stage and might possibly result, in the case of unsuitable dimensioning of the source follower, not only in increased uncertainty in the readout of a pixel, but, also caused by the process variations to which the sensors are subject, also in local distribution of the uncertainty across the pixel matrix of such CMOS imagers (Random Telegraph Signal in CMOS Image Sensor Pixels, X. Wang et al., IEDM Tech. Dig., 2006).

There have been various efforts to decimate excess noise and RTS noise of the source follower. By way of example, one often associates said noise processes in CMOS devices with defects (traps) in the substrate or at interfaces such as the silicon/silica interface. Said traps may locally bind and release charge carriers, which causes RTS noise. If the area where the charge carrier transport takes place is flawed with "many" traps, excess noise will arise according to the idea of the McWorther model (1/f noise and related surface effects in germanium, A. L. McWorther, Thesis (Sc. D.) MIT, 1955). At the circuit level, RTS noise has been reduced, e.g., by clocking the operating current of the source follower. The model concept here is based on the assumption that shortly after switching on the operating current, no charge carriers are captured by traps, and that this will remain so for a period of time (Novel Readout Circuit Architecture for CMOS Image Sensors Minimizing RTS Noise, P. Martin-Gonthier et al., IEEE Electron Device Letters, 2011). However, this innovation does not eliminate the traps themselves, but only reduces their effect for an uncertain time period.

The geometry variation of the source follower transistor was examined in detail and published (Optimization of Random Telegraph Noise Non Uniformity in a CMOS Pixel with a pinned-photodiode, A. Lahav et al., Proc. Int. Image Sens. Workshop 2007; RTS Noise Impact in CMOS Image Sensors Readout Circuit, P. Martin-Gonthier et al., 16th IEEE International Conference on Electronics, Circuits, and Systems, 2009). Alternatively, one has been able to show that RTS and excess noise can be minimized even by relatively simple layout measures in that the current-carrying area of the transistor no longer contacts the field oxide, which is often relatively poor in quality for production-related reasons (Custom transistor layout design techniques for random telegraph signal noise reduction in CMOS image sensors, P. Martin-Gonthier et al., Electronic Letters, 2010). The gain in noise performance thus published is to be evaluated as positive if one takes into account that no process modifications need to be performed to achieve it. However, by contrast, a substantial improvement in the noise performance was achieved by not adapting the geometry or the layout of standard structures, but by using an additional implantation (A CMOS Image Sensor with a Buried-Channel Source Follower, X. Wang et al., ISSCC 2008; A CMOS Image Sensor With In-Pixel Buried-Channel Source Follower and Optimized Row Selector, Y. Chen et al., IEEE Transactions on Electron Devices, 2009). This additional implantation is used for defining the current-carrying channel of the source follower underneath the silicon/silica interface. Even though the idea of buried MOS dates back at least to the year 1976 (Conductance of Ion-Implanted Buried-Channel MOS Transistors, W. Schemmert et al., Transactions on Electron Devices, 1976), the innovation achieved is enormous since the noise performance has been enormously improved at manageable technological expense and without any or with possibly only a small loss regarding the filling factor of a pixel.

The following publications also described techniques addressing low-noise pixel readout: "A Low Noise CCD Output Amplifier" & "The Low Light Level Potential of a CCD Imaging Array", R. J. Brewer, International Electron Devices Meeting 1978; U.S. Pat. No. 4,074,302; U.S. Pat. No. 5,357,128; "The Double-Sided Floating-Surface Detector: An Enhanced Charge-Detection Architecture for CCD Image Sensors", E. Roks et al., ESSDERC 1995; "The Double-Sided Floating-Surface Detector: An Enhanced Charge-Detection Architecture for CCD Image Sensors", E. Roks et al., IEEE Transactions on Electron Devices 1996; Paper "A Bipolar Floating Base Detector (FBD) For CCD Image Sensors", E. Roks et al., IEDM '92; U.S. Pat. Nos. 5,464,997 & 5,593,910; U.S. Pat. No. 5,229,630; "A High Sensitivity Output Amplifier for CCD Image Sensor", Y. Matsunaga et al., International Electron Devices Meeting 1987; Paper "A New high Sensitivity Photo-transistor for Area Image Sensors", H. Yamashita et al., IEDM '88; U.S. Pat. No. 4,984,045; U.S. Pat. No. 5,060,070; and U.S. Pat. No. 5,712,498.

SUMMARY

According to an embodiment, a semiconductor structure may have: a semiconductor layer of a first conductivity type, a photosensitive zone configured such that photogenerated charges may be accumulated in a first potential well; a region of the first conductivity type, formed in the semiconductor layer, for temporarily storing the photogenerated charges in a second potential well; a transfer gate between the region of the second conductivity type and the photosensitive zone for defining a potential barrier between the first and second potential wells during a non-transfer phase, and for eliminating the potential barrier between the first and second potential wells during a transfer phase; and a readout structure for reading out the temporarily stored photogenerated charges, which includes a JFET, the gate of which is formed by the region of the second conductivity type.

According to another embodiment, a method of producing a semiconductor structure including a semiconductor layer of a first conductivity type, a photosensitive zone configured such that photogenerated charges may be accumulated in a first potential well; a region of the first conductivity type, formed in the semiconductor layer, for temporarily storing the photogenerated charges in a second potential well; a transfer gate between the region of the second conductivity type and the photosensitive zone for defining a potential barrier between the first and second potential wells during a non-transfer phase, and for eliminating the potential barrier between the first and second potential wells during a transfer phase; and a readout structure for reading out the temporarily stored photogenerated charges, which includes a JFET, the gate of which is formed by the region of the second conductivity type, may have the steps of using, for producing the channel area of the first conductivity type, a channel threshold voltage implantation, a drain extension implantation, or a halo implantation, or using, for producing the drain and source terminals, an implantation through the insulating layer, using, for separating the diffusions of the drain and source terminals, LOCOS or STI, employing, for generating the further well of the second conductivity type, an implantation process step for producing the well of the second conductivity type, an implantation process step for producing a PMOSFET or a channel threshold voltage implantation process step.

According to another embodiment, a method of producing a semiconductor structure including a semiconductor layer of a first conductivity type, a photosensitive zone configured such that photogenerated charges may be accumulated in a first potential well; a region of the first conductivity type, formed in the semiconductor layer, for temporarily storing the photogenerated charges in a second potential well; a transfer gate between the region of the second conductivity type and the photosensitive zone for defining a potential barrier between the first and second potential wells during a non-transfer phase, and for eliminating the potential barrier between the first and second potential wells during a transfer phase; and a readout structure for reading out the temporarily stored photogenerated charges, which includes a JFET, the gate of which is formed by the region of the second conductivity type is implemented in CMOS.

According to another embodiment, a method of producing a semiconductor structure including a semiconductor layer of a first conductivity type, a photosensitive zone configured such that photogenerated charges may be accumulated in a first potential well, and a region of the second conductivity type, formed in the semiconductor layer, for temporarily storing the photogenerated charges in a second potential well, may have the steps of controlling a transfer gate between the region of the second conductivity type and the photosensitive zone, for defining a potential barrier between the first and second potential wells during a non-transfer phase, and eliminating the potential barrier between the first and second potential wells during a transfer phase; and reading out the temporarily stored photogenerated charges by means of a JFET, the gate of which is formed by the region of the second conductivity type.

The core idea of the present invention consists in having recognized that it is possible to achieve a lower-noise readout of photogenerated charge of a semiconductor structure with a transfer gate for defining and eliminating a potential barrier to a potential well of a buffer zone of the semiconductor structure when one uses, as the readout structure for reading out the buffered photogenerated charges in the potential well of the buffer zone, such a readout structure which includes a JFET, the gate of which is formed by the buffer zone.

Accordingly, in accordance with an embodiment of the present invention, a semiconductor structure includes a semiconductor layer of a first conductivity type, a photosensitive zone configured such that photogenerated charges are collectable in a first potential well, a region, formed in the semiconductor layer, of the second conductivity type for buffering the photogenerated charges in a second potential well, a transfer gate between the region of the second conductivity type and the photosensitive zone for defining a potential barrier between the first and second potential wells during a non-transfer phase and eliminating the potential barrier between the first and second potential wells during a transfer phase, and a readout structure for reading out the buffered photogenerated charges, said readout structure including a JFET, the gate of which is formed by the region of the second conductivity type.

BRIEF DESCRIPTION OF THE DRAWINGS

Embodiments of the present invention will be detailed subsequently referring to the appended drawings, in which:

FIG. 3a shows a cross-section, which is an alternative to that of FIG. 2, of a PPD in accordance with a conventional design;

FIG. 3b shows a graph comprising the potential curve of the PPD of FIG. 3a;

FIG. 4a shows a cross-sectional view of an LDPD (lateral-drift photodiode) in accordance with a conventional design;

FIG. 4b shows a potential curve of the LDPD of FIG. 4a;

DETAILED DESCRIPTION OF THE INVENTION

Figure 1:
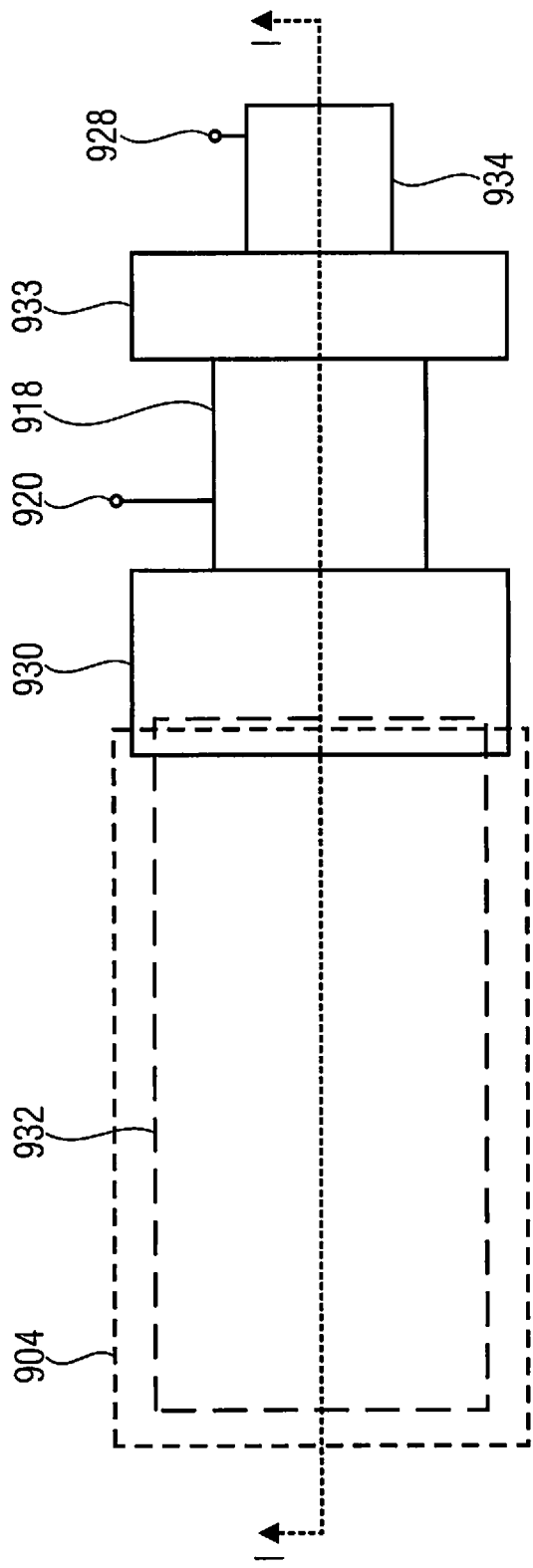
FIG. 1 shows a top view of a PPD (pinned photodiode) of a conventional design.

Before describing advantageous embodiments of the present application with reference to the drawings, it shall be noted that the description is based on the initial assumption of a manufacturability in a CMOS technology, which offers advantages regarding the process cost, or production cost, of course. However, embodiments of a semiconductor structure and of the methods of operating and producing same, which embodiments will be described below, can also be transferred to other process technologies, of course. In this sense, it is merely one advantage of embodiments described below that they allow integrating said structures in CMOS processes, too; however, the embodiments described below are not restricted thereto.

In addition, the framework conditions and considerations which led to the embodiments that were described at a later point in time shall be discussed prior to providing a description of embodiments of the present application.

When taking into account the experiences that have been made in the field of noise reduction of CMOS image sensors and that were presented in the introduction to the description of the present application, one may conclude that improvements in the performance can be achieved essentially by component modifications. Embodiments described below represent semiconductor structures which improve noise performance on the basis of said principles while requiring no or only few process modifications.

To optimize noise performance, charge carriers representing an analog signal should have no contact with traps, if possible. According to the McWorther model, said traps occur predominantly at interfaces such as the silicon/silica interface. Particularly field oxide, which is often grown in a "humid" manner, mostly has a relatively high defect density (*Detailed Analysis of Edge Effects in SIMOX-MOS Transistors*, T. Elewa et al., IEEE Transactions of Electron Devices, 1992; Spatial uniformity of interface trap distribution in MOSFETs, N. S. Saks et al., IEEE Transactions on Electron Devices 1990). This is a possible reason fort he fact that JFETs usually have relatively low 1/f- and RTS-noise contributions (*Physics of Semiconductor Devices*, Third Edition, S. M. Sze et al, ISBN-10: 0471143235, 2007, *Low-Noise Elec-*

*tronic System Design*, C. D. Motchenbacher, ISBN-10: 0471577421, 1993). JFETs are field-effect transistors whose channel resistances are not controlled via an insulated gate electrode made of polysilicon or metal, but via the space charge zone of one or more p-n junctions which fully or partly enclose the channel. For photodetectors in CMOS technology for low-noise sensor systems based on large photoactive regions, a JFET readout may be implemented without any considerable losses in terms of the filling factor. However, for applications based on pixels with an average pitch, this may not be an alternative.

Embodiments described below utilize a low-noise readout structure based on a WET, which signifies a compromise regarding the filling factor in relation to a MOSFET as the readout transistor. No or only few process modifications need to be performed in order to integrate the presented readout structures into a CMOS process, which, e.g., already implements pinned photodiodes (PPD) or lateral drift-field diodes (LDPD).

As a preliminary remark, it shall also be noted that in the following embodiments and comparative embodiments, the dopant types are generally also invertible. The top views or top-down view representations shown in the figures sometimes have highly simplified geometries, which may generally be varied or configured to any degree of complexity desired, such as in a prolate, bent, etc. manner as compared to the form presented. In the embodiments shown, additional implantations etc., which may serve for electrically or optically separating diffusions, for example, are also possible.

FIG. 1 schematically represents a pinned photodiode (PPD). The cross-section I-I corresponds to FIG. 2. The PPD essentially consists of a photoactive region, which here is configured, e.g., as a diode having p-n junctions to the epitaxial layer 900, p-well 902 and p$^+$ shield layer 904. The latter insulates the photoactive region 906 from the defects of the Si/SiO2 interface 908. Readout of a PPD is often performed via a conversion of photodetected electric charge to electric voltage, which is defined via a capacitance. Said voltage difference thus generated is mostly read out via a MOSFET in a source follower operation. The latter is not shown in FIGS. 1 and 2.

Figure 2:
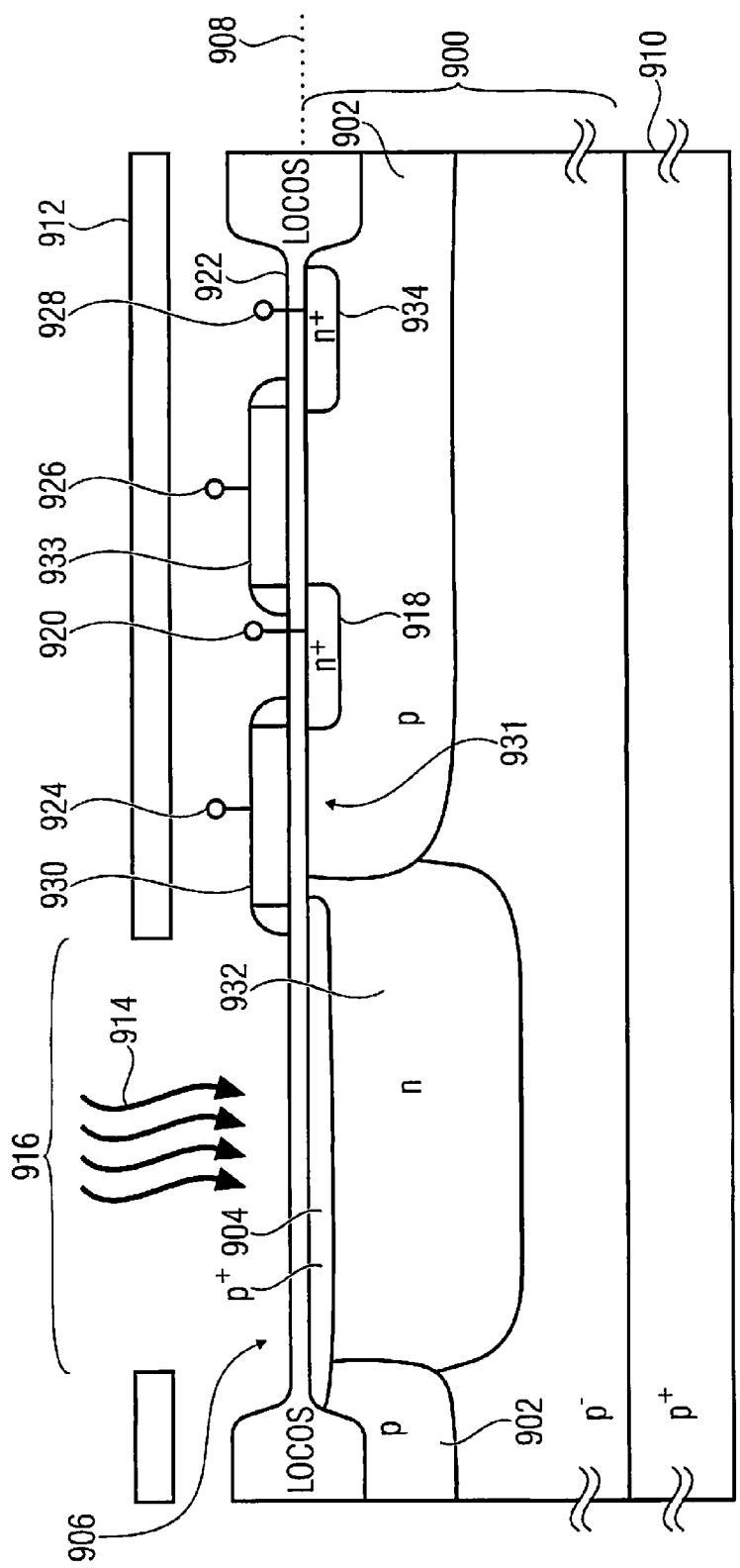
FIG. 2 shows a cross-sectional view along the sectional plane I-I of FIG. 1.

For completeness' sake, it shall also be mentioned that in the PPD of FIGS. 1 and 2 the epitaxial layer 900 is located on a more heavily doped substrate 910, and that areas surrounding the photoactive region 906 are covered from the radiation 914 to be detected by means of a metal screen 912 in that a corresponding opening 916 is formed in said screen 912. A heavily doped n$^+$ region 918 is formed in the well 902 so as to serve, as has just been mentioned, as a buffering node, the so-called floating diffusion (FD), and so as to be connected, e.g., to the gate of a MOSFET which is operated, for example, in a source follower operation and serves for readout but is not shown in FIGS. 1 and 2. In addition to the terminal 920, which contacts the region 918 through the insulating layer 922 arranged on the processing front side 908 of the epitaxial layer 900 or adjoining the latter, a transfer gate connection 924, a reset terminal 926 and a terminal 928 for a supply voltage potential VDD-pixel exist in the PPD of FIGS. 1 and 2. The terminal 924 contacts a transfer gate made of, e.g., polysilicon 930, which is arranged between the well 932 of the photoactive region 906 and the region 918 such that it is separated from the epitaxial layer 900 by the insulating layer 922. Similarly, e.g. polysilicon 931 defines—between the region 918 and a further n$^+$ region 934 within the p-well 902, said region being separated from the epitaxial layer 900 by the insulating layer 922—the gate of a MOSFET which is connected via the reset terminal 926. The drain terminal of the latter MOSFET is contacted via the terminal 928.

FIG. 3a shows a PPD in a configuration very similar to the version of FIGS. 1 and 2. Additionally, FIG. 3b shows the associated potential curve, or potential distribution, inside the PPD along the cross-section through the well 932, the transfer gate 930 and the buffer region 918.

A PPD in accordance with FIGS. 1-3b operates as follows. The photosensitive region 906 is formed by the at least partly depleted n-well 932 and acts as a photodiode. This well 932 is protected against charge recombination centers at the interface 908 to the insulating layer 922 by the heavily doped p$^+$ layer 906. The readout node 918 is protected from the well 932 by the transfer gate 930. The separation of the photosensitive well 932 and of the storage node 918 enables storing photogenerated charge in the photoactive region 906 itself. The potential separation of the potential well of the well 932 from the potential well of the storage node 918 is achieved by switching off the transfer gate 930. The potential curve with the transfer gate switched off is depicted by the continuous line in FIG. 3b, whereas the switched-on state is represented by the dashed line. Thus, FIG. 3b shows the potential barrier 940 with the transfer gate switched off. In addition, an arrow 942 illustrates filling of the potential well of the storage node 918 by the photogenerated charges transferred via the transfer gate 930, and, in correspondence therewith, an arrow 944 illustrates the reduction of the potential well in the photoactive region 906 on account of the discharge due to the irradiation 914.

In PPDs of FIGS. 1-3b, the reset noise is reduced via the reset transistor comprising the reset gate 933 as long as the capacitance of the storage node 918 is kept small as compared to that of a conventional photodiode, wherein the capacitance is formed by the entire device (5, 6). In addition, with PPDs, a plurality of storage nodes 918 may be present, which enables demodulating optical signals. To this end, the different storage nodes may be directly connected to the photosensitive region 906 by transfer gates. Alternatively, a connecting node, which is formed by an additional gate, may exist which mutually connects the different storage nodes by transfer gates in the manner of a CCD.

FIGS. 4a and 4b show a PPD structure which is changed as compared to FIGS. 3a and 3b, namely a structure with a modulated doping profile for avoiding speed problems in the charge transport from the photoactive region 906 to the storage node 918. As may be recognized, the structure of the PPD remains essentially the same as that of FIG. 3a. However, the well 932' extends to the storage node 918. Moreover, between the transfer gate 930 and the photosensitive region 906, a collection gate 944 is located such as to be separated from the epitaxial layer 900 by the insulating layer 922, and is contacted via a collection gate connection 946; the collection gate 944 may be partly inserted—while being insulated from the transfer gate 930 by an insulating layer and/or a dielectric 948—below the transfer gate 930 between the transfer gate 930 and the insulating layer 922.

In the case of an LDPD as is shown in FIG. 4a, photogenerated electron hole pairs are separated by a drift field 950, which enables a high transfer speed as compared to a diffusion-based transfer in accordance with the PPDs of FIGS. 1-3b. The charge carriers or electrons are accelerated toward the collection gate 944, which is connected, e.g., to a constant potential, as a result of which the charge carriers may be accumulated in a potential well there. By activating the transfer gate 930, the potential barrier 940 is lowered, and charge is transferred into the storage node 918. In order to prevent the potential well 941, which here forms underneath the collection gate 944 and is fed by the photoactive region 906, from being inundated by photogenerated charge carriers, a drain gate may additionally be provided in order to allow excess charges to be drained. Generally, more gates may be used in order to enable demodulation of the irradiation 914 by the photodetector and/or the PPD itself. In this respect, please refer to DE 10 2009 037 596 A 1, reference being additionally made to DE 10 2009 020 218 B3 with regard to the lateral doping profile of the well 932.

For correct operation of the component, the well 932' is connected to the storage node 918 in such a manner that the well may be fully emptied, which is advantageous for a steady and sufficiently large potential gradient. The potential well 941 should be configured such that the storage node 918 may be decoupled from same by switching off the transfer gate 930, and so that the gradient for the storage node is sufficiently large so as to quickly transfer the photogenerated charges and to fully empty the photoactive region 906 via the gate 933 during the reset operation.

The problem which will be overcome later on by the embodiments of the following figures shall now be illustrated by means of FIGS. 1-4b.

In order to be able to compete with CCD image sensors in such strict applications as imaging for scientific applications, optimization of the dynamic range in CMOS imagers is a large problem with which scientists have been struggling since the early 1970s. CMOS imagers make use of the diversity offered by such processes. A readout in a region of interest, an in-pixel gain, in-pixel intelligence or on-chip signal processing have all been made possible. The approach of an on-chip camera has led to a minimization of the system cost.[8] Nevertheless, CCD imagers still outperform their CMOS counterparts in terms of some parameters such as linearity or noise performance.[9,10] This provides the need for more creative approaches so as to become competitive with regard to CCD sensors and so as to obtain more market potential in fields such as scientific imaging, in automotive applications, in medical imaging, or in security/surveillance systems.

Early detectors that were used in active CMOS pixel sensors (CMOS-APS, CMOS active pixel sensors) exhibited a large degree of reset value uncertainty caused by the large storage capacity. With the introduction of pinned photodiodes (PPD), the equivalent capacity of the storage node was separated from the photoactive region and thus drastically reduced.[5,6] Nevertheless, the reset noise still remained the predominant source of noise in CMOS-APS. With the introduction of a correlated double sampling (CDS), it can be reduced further.[11,12] CDS is a filtering process subtracting two samples: the reset value I subtracted from the actual signal value. In this context, one assumes that both values have the same reset value uncertainty, or, in other words, that they are correlated. However, CDS is typically implemented by peripheral circuitry, and it consequently cannot reduce the noise before the signal has been influenced by the noise. For imagers in a global-shutter mode, which is used for applications wherein smear effects are to be avoided, CDS circuitry becomes quite complex since storage nodes may be implemented for each pixel in order to secure the reset value of same.

An analysis has shown that for APS having a reset noise reduction by means of CDS, the source follower transistor (SF) often becomes the dominant source of noise.[13] The noise of such SF transistors may be modeled as a combination of sources of thermal noise, flicker noise, and RTS noise. Said noise sources may partly also be filtered by the CDS; however, for the reasons already described above, this is not necessarily the best approach. More importantly, it has been shown that RTS cannot be fully eliminated by using with CDS.[14]

In order to eliminate RTS and flicker (excess) noise, it is important to understand how it comes about. Said noise sources are often associated with defects (traps) occurring in the substrate or at interfaces such as the Si—$SiO_2$ interface. Such traps may bind or release charges which form part of the flow of current, which causes RTS noise. If the region wherein current is flowing exhibits many such traps, flicker noise will arise according to the McWorther model.[15]

At the circuit level, such noise processes may be reduced by switching off the biasing current prior to readout. This switched biasing method is based on the assumption that traps are empty when there is no current, which is still true for a certain period of time following switch-on of the bias.[16] Nevertheless, this approach does not reduce the number of traps itself by means of a compromise regarding deterministic interferences, but only reduces the effects such traps may have.

For the purpose of reducing the number of traps the source follower itself may be carefully designed. A variation of the geometry has already been looked at in detail.[17,18] In addition, it has been shown that RTS noise may be reduced by means of a suitable layout without changing the size of the transistor. To achieve this, the channel of the transistor is formed separately from LOCOS sites, which typically comprise higher defect densities, which results in RTS and flicker noise.[19-21] The improvements reported are considerable and involved no process modifications.

As compared to said approaches, which are CMOS-compatible but consequently are limited, more creative approaches may be implemented. Several complex approaches have already been applied in order to minimize noise—many of them are intended for CCD detectors.[7] All of them strive for less contact with generation recombination centers caused by defects and—according to the McWorther model—are located mainly at the Si—$SiO_2$ interfaces. This may explain why lower flicker noise is often reported for bipolar devices and JFET transistors than for standard MOSFETs.[22,23]

Standard bipolar devices involve input currents and may thus not be applicable to simple readout structures. It has been reported how MOS transistors may operate in a bipolar mode without requiring any input current.[24] Since, e.g., a PMOS is formed by two $p^+$ diffusions in an n-well, what is at hand is a lateral p-n-p transistor. This may be enabled by a forward bias of the source-well diode. By biasing the gate, the current may then be forced to be underneath the gate oxide; thus, a contact with traps located at the interface may be avoided. Nevertheless, the device comprises an inherent parasitic p-n-p transistor formed by a $p^+$ implant, an n-well and a p-substrate, which causes a current through the substrate, which may subsequently increase the dark current and thus may deteriorate the noise performance. This effect may be reduced by duly biasing the well. However, it results in the need for an additional non-standard power supply level. The transconductance may also be insufficient. To achieve high sensitivity, the collector-to-emitter ratio may be maximized, which typically leads to round and, thus, large transistors. A bipolar floating base detector has been reported.[25] As the gain stage it uses a vertical bipolar transistor which yields the input current from a MOSFET modulated from the back gate by the accumulated charge. The base current is located in close proximity of the gate oxide, which influences the noise performance. MOSFETs modulated from the back have been used in a large variety for CCD imagers.[26-31] In all of the reported approaches there are low-dopant portions which are involved in either a readout current or a charge storage, in the vicinity of or in direct contact with Si—SiO$_2$ interfaces. Some of them also may use additional polysilicon gates for duly biasing the storage node, so that charges may further be transferred in the manner of a CCD. They also have to be carefully designed in order to yield a continuous gradient in a transfer mode while utilizing substantial potential differences. However, this may affect the metal wiring and inter-metal dielectrics that may be used.

In comparison to the rather complex approaches just described it is possible to improve the noise properties of a PPD with few process modifications when using a buried MOSFET as a source follower component. This provides significantly improved noise properties; however, additional implantations and an additional mask may still be used (cf. 32, 33).

What follows is a presentation of embodiments which enable achieving satisfactory noise properties without requiring any, or requiring only few, additional measures in the process operation. The embodiments utilize a WET structure and enable integration of the semiconductor structure into a CMOS-APS (active pixel structure). Implementation of the following embodiments is therefore possible without any process variations, in dependence on, e.g., the available threshold voltage adaptation implantations and voltage levels. At worst, two additional implantations are needed for the following embodiments in order to implement the LDPDs and PPDs shown there, as will be explained below.

With reference to FIGS. 5-7b, an embodiment of a semiconductor structure will initially be described which is based on a PPD without any laterally varying doping profile; however, the subsequent figures will show that the principles of this embodiment may easily be transferred to LDPDs.

Figure 5:
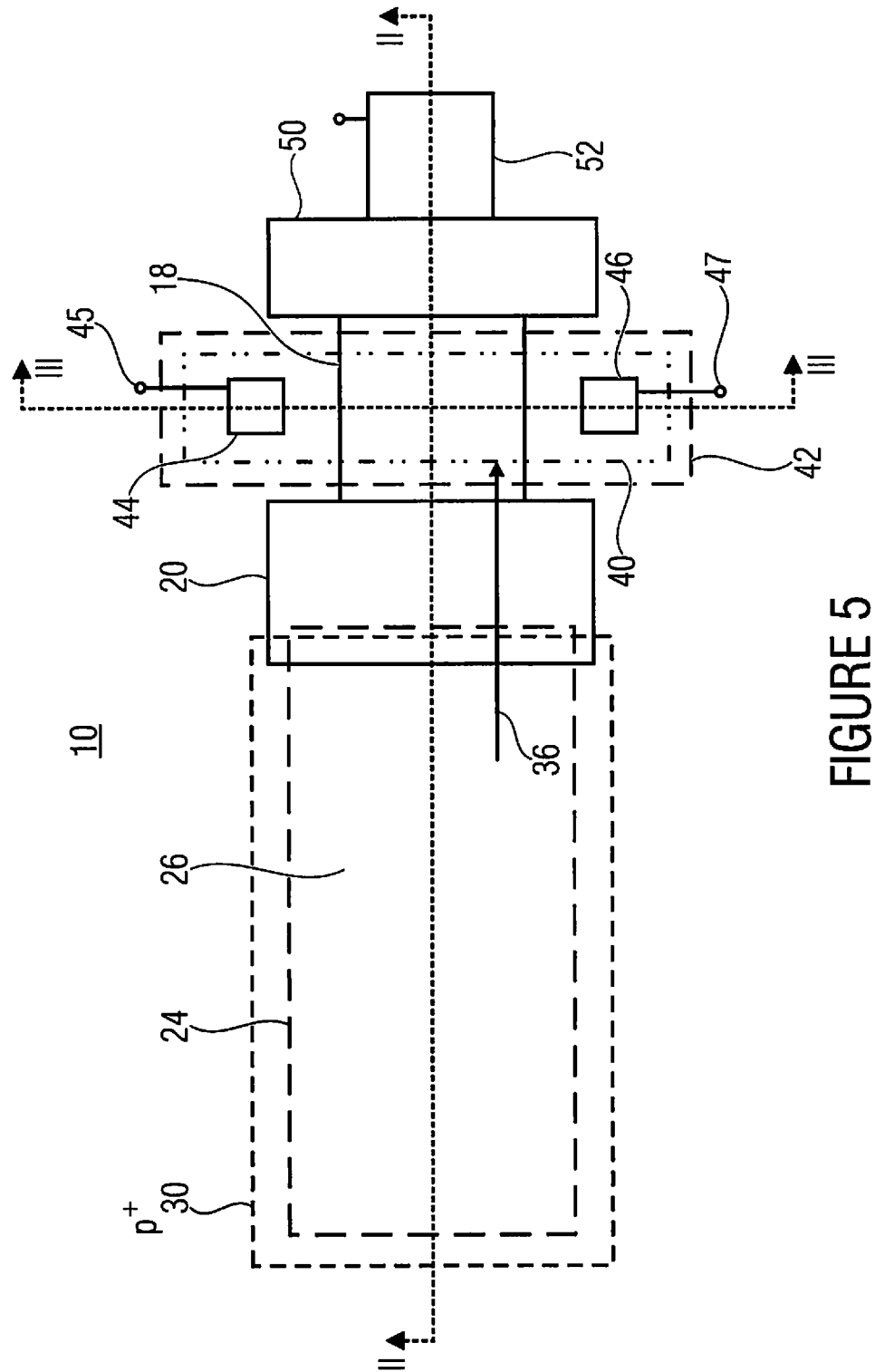
FIG. 5 shows a top view of a semiconductor structure in accordance with an embodiment which has a PPD with an integrated JFET readout structure.

In particular, FIG. 5 shows a semiconductor structure 10 comprising a semiconductor layer 12 of a first conductivity type. As has been said, in the embodiments of the present application, the indications of the conductivity type are reversible in order to arrive at alternative embodiments. In accordance with the present example, the semiconductor layer 12 is the p conduction type. By way of example, it is an epitaxial layer arranged on a more heavily doped substrate 13 of the same conductivity type, which is not necessary, however. The semiconductor layer 12 might also be the substrate itself or a well in the substrate or the like. The same also applies to the subsequent embodiments: even though the following explanations are given for a CMOS process on the basis of a p$^+$ substrate 13 and a high-impedance p$^-$ epitaxial layer 12, said embodiments and explanations are generally also transferable to any wafer substrates. Alternatively, for example, it is possible for only a high-impedance epitaxial layer 12, a high-impedance wafer substrate, or a high-impedance well implantation to exist.

The semiconductor structure 10 further includes a photosensitive zone 14 formed by a p-n photodiode 16, formed within the semiconductor layer 12, or by its space charge zone. The photodiode 16 is configured to accumulate photogenerated charges in a first potential well 19; additionally, reference is made to FIG. 8, which schematically shows the potential curve in the charge transfer direction. Moreover, the semiconductor structure 10 includes a region 18 of the n conduction type which is formed in the semiconductor layer 12 and is intended to temporarily store (buffer) the photogenerated charges in a second potential well 21. A transfer gate 20 is provided between the region 18 and the photosensitive zone 14 for defining a potential barrier 23 between the first and second potential wells during a non-transfer phase, i.e. when the potential at the transfer gate corresponds to a first potential, and for eliminating the potential barrier 23 between the first and the second potential wells during a transfer phase, i.e. when the potential at the transfer gate corresponds to a second potential. Consequently, the structure consisting of the transfer gate 20, an insulating layer 32, the region 18 and the well 24 with the inversely conductive material between the latter regions may be regarded as a FET structure. A readout structure of the semiconductor structure 10 for reading out the temporarily stored photogenerated charges in the potential well 21 comprises a JFET 22, the gate of which is formed by the region 18.

In particular, the p-n photodiode 16 exhibits a p-n junction 24 buried in the semiconductor layer 12, namely in that the semiconductor structure 10 comprises an n-well 26, the p-n junction 24 being formed between said n-well 26 and a surrounding adjoining portion of the semiconductor layer 12. The well 26 of the n conduction type is covered, in the photosensitive zone 14 at a front side 28 of the semiconductor layer 12, by a layered semiconductor area 30 of the p conduction type, which has a higher doping concentration than the semiconductor layer 12, so that the first potential well 19 is spaced apart, i.e. buried, from an insulating layer 32 at the front side 28 of the semiconductor layer 12. Via a conduction structure not depicted in detail in FIG. 6, it is possible for the heavily doped near-surface semiconductor area 30 to be contacted, for example through the insulating layer 32, so as to be permanently connected, e.g., to a substrate potential to which a potential may also be set at a substrate contact which might be located, e.g., on a rear side 33 facing away from the front side 28, such as a potential of 0 volts. Disadvantageous surface effects at the interface 28 may thus be avoided.

The insulating layer 32 may be, e.g., the gate oxide layer of a CMOS circuit, of which the semiconductor structure 10 forms a section. Said CMOS circuit accommodates, e.g., an entire array of semiconductor structures 10 which represented a pixel in each case, as it were, and in this manner together formed a pixel array. For example, the CMOS circuit also includes conductor lines above, i.e. on that side of the insulating layer 32 which faces away from the substrate 13, such as in suitable conductor line planes above the insulating layer 32, for example. As has been said, however, the CMOS circuit configuration is exemplary only. Similarly, the transfer gate 20 may be a polysilicon material which is mounted on the front side 28 such that it is separated from the epitaxial layer 12 merely by the gate oxide 32, so as to form a corresponding FET structure. The polysilicon of the transfer gate 20 is, e.g., part of a polysilicon plane or layer of a CMOS structure. The transfer gate 20 and the well 26 may be formed such that the well 26 extends as far as below the transfer gate 20 so as to there adjoin a well 34 of the p conduction type having a higher doping concentration than a doping concentration of the semiconductor layer 12, the region 18 and/or the JFET 22 being imbedded in the p-well 34.

Figure 6:
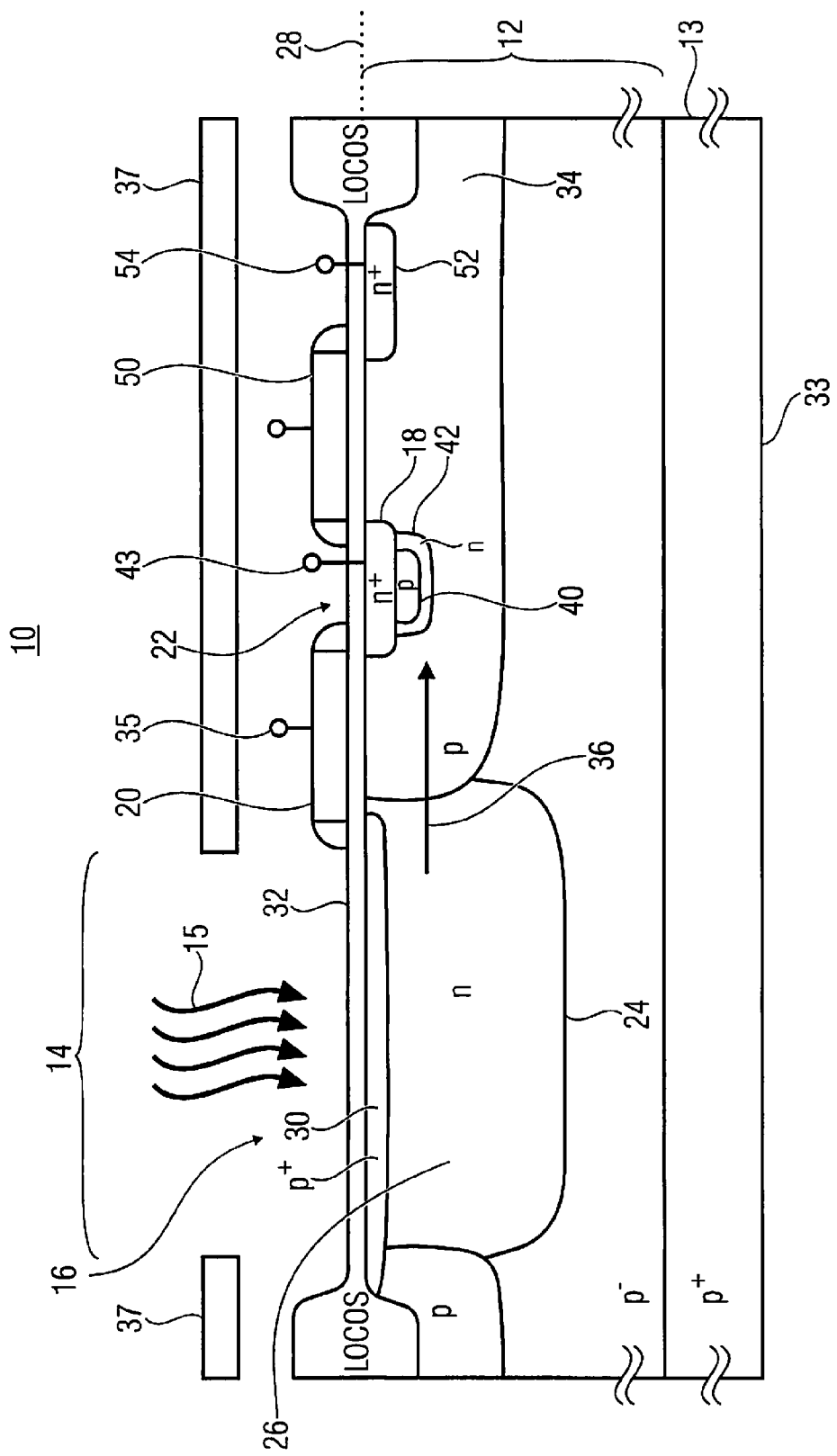
FIG. 6 shows a cross-sectional view along the sectional plane II-II of FIG. 5.
Figure 7:
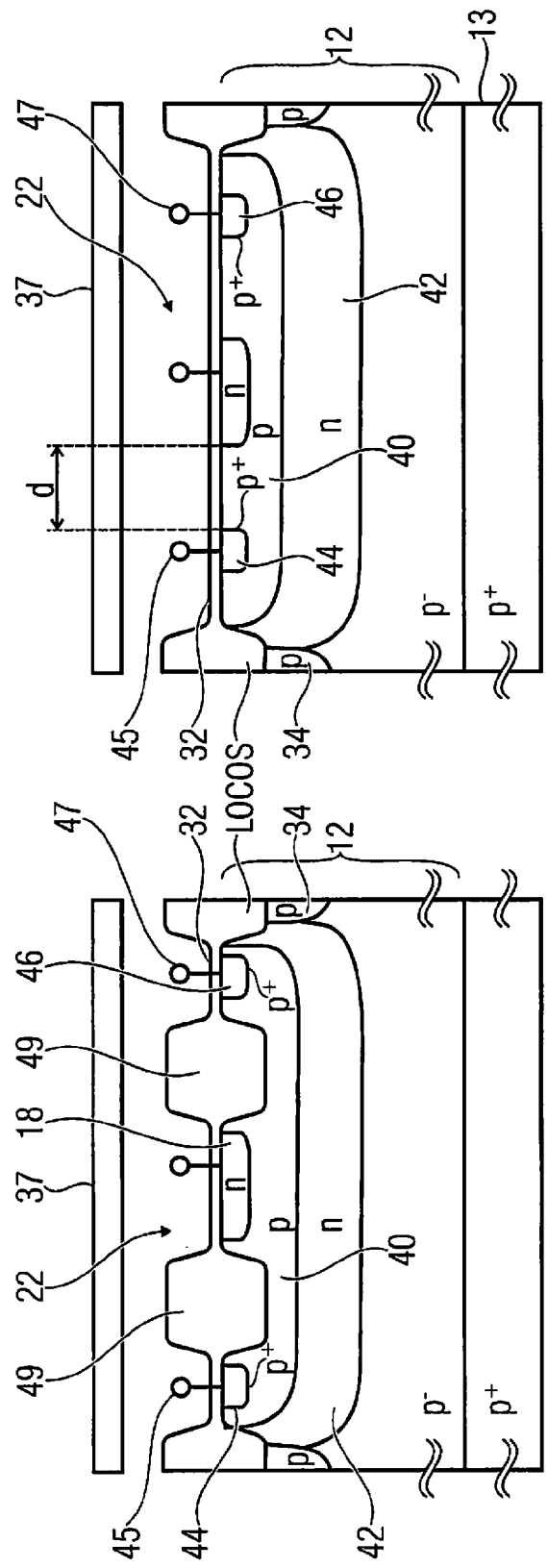
FIGS. 7a and 7b show cross-sectional views along the sectional plane III-III of FIG. 5 in accordance with different embodiments.

As may well be seen in FIG. 6, the region 18, which sometimes is also referred to as a storage node, may be formed adjacently to the interface 28 and/or the insulating layer 32. It is via suitable conductor lines that, e.g., the transfer gate 20 is connected to a control circuit, which may be integrated, by way of example, in the same CMOS circuit of which the semiconductor structure 10 forms a part, for example. Accordingly, FIG. 6 shows, by way of example, a TG terminal 35 for contacting the transfer gate 20 in a schematic manner. In yet other words, it is possible for the semiconductor structure 10 to be integrated in a layer stack which starts with the substrate 13 and continues with the epitaxial layer 12 and the insulating layer 28 and is then continued with a layer sequence which comprises a polysilicon layer structured to form the transfer gate 20, and following this, still further structured metal planes which are embedded in the insulating material and may be locally connected with one another and with parts of the above-mentioned polysilicon layer, such as the transfer gate 20, by means of via holes (through-connections). For example, an optional photo screen 37 may also be part of said very last-mentioned metal planes, for example, said optional photo screen 37 being structured, e.g., to form an opening at the photosensitive zone 14 so as to prevent irradiation 15 from affecting regions surrounding the zone 14, such as space charge zones adjoining the storage node 18, but to allow the zone 14 to be irradiated 15. The photo screen 37 may also be made of metal and may be located, in relation to the insulating layer 28, on that side of the latter which faces away from the epitaxial layer 12 when, e.g., the semiconductor structure 10 is intended to detect radiation 15 in FIG. 6 from above. Irradiation from both sides or from below would naturally also be possible, however, in which case a corresponding photo screen might optionally be arranged, e.g., on the side 33.

Said very control circuit briefly mentioned above may also be intended to operate the p-n junction 24 in the reverse direction in that a substrate end is held at a mass potential, for example, on the rear side 33 of the substrate 13, and in that the well 26 is intermittently biased to a potential which leads for a reverse-direction operation with a corresponding space charge zone design. Biasing is achieved by placing the transfer gate 20 during the transfer phase and by controlling the reset transistor, which will be mentioned later on, in a pass state. The space charge zone is then reduced by the irradiation 15, and the resulting charge carriers are sucked off, as a function of their conduction types, and/or accumulated in the above-mentioned potential well, which is separable from the potential well in the region 18 via the transfer gate 20.

As may be seen in FIG. 6, the JFET 22 may comprise a channel area 40 of the p conduction type which adjoins the region 18 and is embedded in a further well 42 of the n conduction type and comprises a drain terminal 44 and a source terminal 46 so as to form the JFET 22 together with the region 18. The channel area 40 is thus completely enclosed by the material of the n conduction type, namely by the region 18 together with the well 42, and it extends, for example, as may be seen from FIGS. 5 and 7a and 7b, in the lateral direction in a manner transverse to a drift current direction 36 along which the photogenerated charges move from the first potential well 19 into the second potential well 21 during the transfer phase. In particular, the well 42 and the channel area 40 extend, e.g., along the lower edge of the region 18 adjoining the insulating layer 28 so as to hit upon—in a lateral manner in relation to the region 18 as seen along the direction 36—the interface 28 of the epitaxial layer 12, where, in turn, the more heavily doped p drain and source terminal regions 44 and 46 are present. In this manner, the schematically depicted circuit node 43 of the region 18 is connected to the gate of, or forms the, JFET 22, and terminals 45 and 47 for a drain terminal and a source terminal of the JFET 22 may be provided for contacting, through the insulating layer 32, the drain and source terminal regions 44 and 46 and to connect them to the above-mentioned evaluation circuit. Said evaluation circuit is then able to sense the charge located in the region 18, the effect of disadvantageous surface effects being decimated. The connection of the terminals 45 and 47 to such an evaluation circuit may be effected, again, via the above-mentioned metal planes and corresponding via holes.

In other words and while referring in somewhat more detail to possible production methods, FIGS. 5, 7b represent the manner in which a JFET readout structure may be integrated into a PPD such that low-noise readout becomes possible at a low loss in terms of the filling factor while requiring no or only few process modifications. In addition to a "normal" PPD, the structure underneath the floating diffusion has a p implantation, which represents the current-carrying channel of a JFET transistor. Said channel is embedded in an n-well. The p channel is contacted via two $p^+$ regions, which represent the source and drain of the JFET. One may gather from FIG. 7a at 49 that the diffusion regions may be separated via LOCOS or, as is shown in FIG. 7b, may be separated via defining a reasonable distance, the diffusions being implanted, e.g., through the gate oxide. Alternatively, insulation via STI is also possible; however, in the event of a lack of shielding of the traps, this would result in a considerable noise contribution.

As implantations for the p channel, wells, channel threshold voltage adaptation implantations, drain extension implantations or halo implants may be used if their concentrations are above that of the n-well. As the n-well, the implantation of the PPD, an n-well of, e.g., a PMOSFET or a possible channel threshold voltage adaptation implantation may be used. If such an implementation is possible without producing parasitic punch-through, avalanche or Zener effects on account of the dopant concentration, the structure can be implemented without any process modifications. If this is not possible, only 1-2 implantations may be used, which will have to be defined in accordance with the boundary conditions mentioned.

The mode of operation of the structure is based on a modulation of the channel by varying the potential of the floating diffusion, which here is used as a p-n gate. Thus, the JFET readout structure is merged with the floating diffusion, which serves as a storage node of the photogenerated charge carriers. The maximum channel resistance is achieved at a reset level at the floating diffusion. The space charge zone, which narrows the channel, decreases in terms of its extension upon accumulation of charge carriers in the FD. In the event of suitable dimensioning, the channel will be modulated not only from above, but from all sides if the regions around the channel are not fully depleted. By means of further implantations of more heavily doped n regions, the transconductance of the transistor may be increased. Generally, said transconductance may be varied by means of the implantation dosages and the channel geometry.

Figure 9:
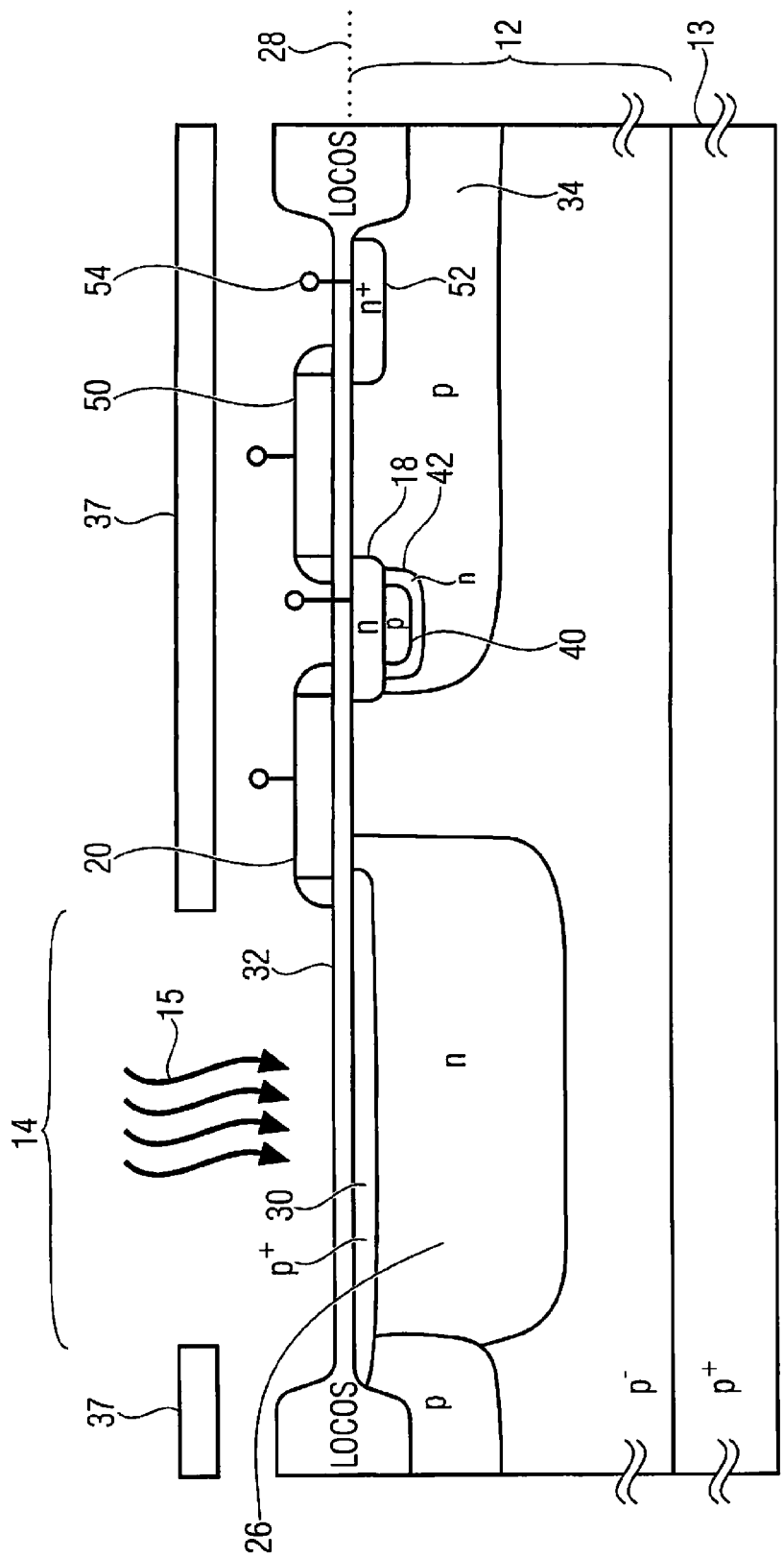
FIG. 9 shows a sectional view, which is an alternative to that of FIG. 6, in accordance with an alternative embodiment.

For completeness' sake, FIG. 9 also shows that the abutment between the well 26 and the well 34 at the transfer gate 20 need not necessarily be configured such that the wells directly abut each other, but that the abutment may also be configured such that the well 34 first and foremost embeds the JFET 22 and its well 42, but that the channel below the transfer gate 20 is formed by the less heavily doped material of the epitaxial layer 12, i.e. that a distance is provided between the well 26 and the well 34.

For completeness' sake, it shall also be noted that in the semiconductor structures of FIGS. 5-9, the storage node 18 may be "read out" not only via the JFET 22, but that the region 18 may be coupled, via a reset gate 50, to a further heavily doped n region 52 in the well 34, the latter region being connected, e.g., to a supply potential terminal 54. The reset gate 50 may also be formed of polysilicon and it is separated from the p material of the well 34 by the insulating layer 32. The reset gate 50 may belong to the same structured polysilicon layer as the transfer gate 20 and is arranged between the region 18 and the region 52 so as to form, along with the material of the well 34 which acts as a channel region, a FET, via which the node 18 and the well 26 may be set (with the transfer gate 20 switched on) to a supply potential, as was mentioned above.

Thus, in the above embodiments, the floating diffusion 18 controls—instead of using a standard floating diffusion in combination with a MOSFET for readout—a p channel JFET from above, directly via its transfer capacitance, so that the current-carrying channel is positioned at a distance from the surface 28. In the case of the PPD as was represented in FIGS. 5-9, the channel is formed within an n-well 42 of its own, whereas in the subsequent embodiment of an LDPD, this is laid out differently, namely in that the channel is directly surrounded by the already existing well for forming the photoactive p-n junction. As is depicted in the figures, the current flows, e.g., perpendicularly to the transfer direction 36 of the photogenerated electrons.

As became clear from FIGS. 7a and 7b, the drain and source regions 44 and 46 may be defined by $p^+$ diffusion zones, which for their part may be separated from the floating diffusion region 18, which will become useful, for example, when the doping concentration of the region 18 is too high. In this manner, Zener and avalanche effects may be avoided. However, the separation should not be too pronounced, so that the contact between the flow of current and the oxide is avoided in the lightly doped regions. Since the defect density of the gate oxide 32 is typically small in comparison to LOCOS sites 49 or STI sites (not shown) (cf. 20, 21), the alternative of FIG. 7a comprising the separation by means of LOCOS or STI is evaluated to be somewhat disadvantageous as compared to the approach of FIG. 7b. To avoid the traps positioned in the vicinity of the region between the drain and the source 44 and 46, respectively, and the region 18, additional implantations may be used, which may be provided, for example, to ensure that no Zener or avalanche effects occur. In standard active pixel structures, the FD 18 is normally heavily doped in order to avoid a Schottky diode when it is connected to the source follower or a PMOS reset switch. However, if an NMOS reset switch is used, the source of which is formed by the FD 18 itself in combination with the JFET readout structure, as it is the case in the embodiments presented, there will be no more necessity to absolutely provide a high doping concentration of the region 18. Consequently, Zener and avalanche effects may be suppressed by using a smaller doping concentration. In such a case of a semiconductor structure, there would no longer be a necessity for a contact of a lightly doped region through the surface 28.

For the purpose of unproblematic implementation in a CMOS process, the doping concentration of the channel 40 should be higher than for the well 34, but smaller than for the floating diffusion 18. For this purpose, e.g. p threshold adaptation implantations for NMOS transistors may be used. The additional n-well 42 for the PPD may result from the same implantation from which the photodiode is formed, or from an n-well used for embedding PMOS transistors. However, the depth of the channel 40 and its doping concentration should be directly adapted to the readout circuit which includes the JFET structure 22. Thus, in the worst case the improvement in the noise performance is achieved at the expense of two additional implantation steps and cost incurred for the masks in the case of the PPD, whereas in the case of the LDPD described below, only one additional mask, at a maximum, and one additional implantation step may possibly be employed.

Figure 10:
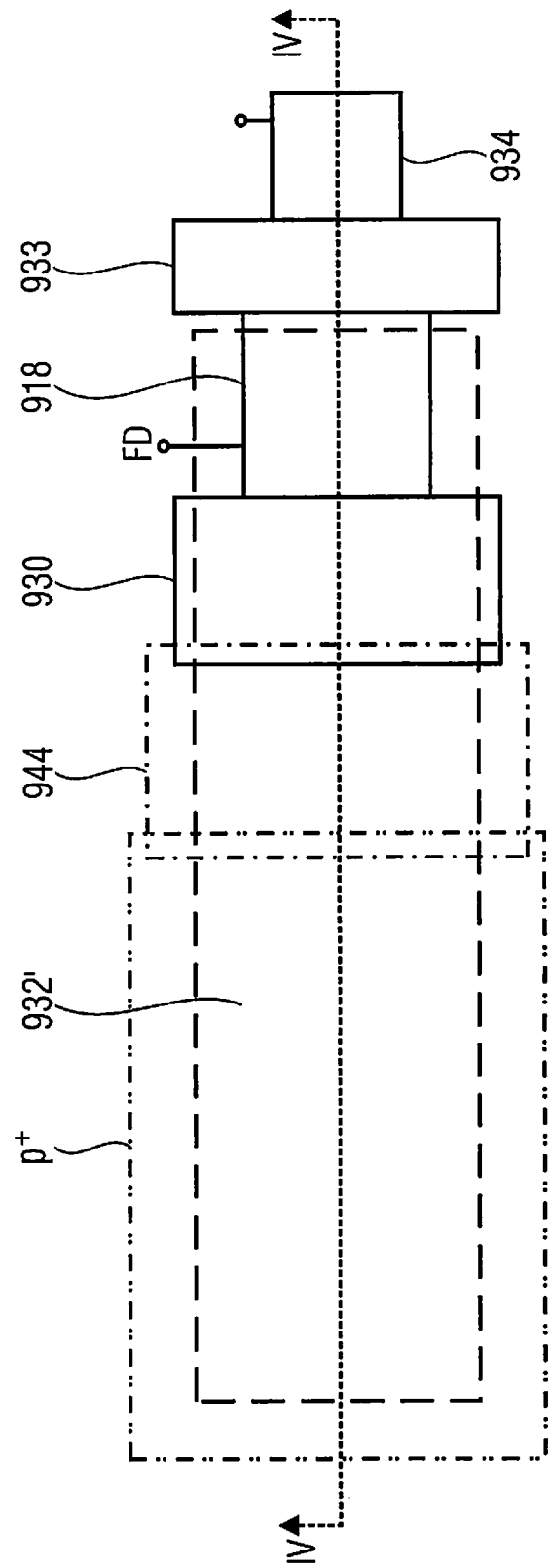
FIG. 10 shows a top view of the LDPD of FIG. 4a, FIG. 4a representing the sectional view along the plane IV-IV.

The above explanations mainly related to a PPD without any lateral drift doping concentration variation. Embodiments utilizing a lateral drift-field diode will be presented below. With reference to FIGS. 4a and 4b, the essential elements of a lateral drift-field diode have already been presented. For completeness' sake, FIG. 10 shows a top view. As was already described, in this photodetector type the well 932', wherein charge carriers are transferred, is connected to the storage node 918—to the floating diffusion.

Generally, pinned photodiodes are popular because of their low-noise performance. Nevertheless, PPD approaches for applications based on large-area detectors may become unsatisfactory in terms of their speeds. Such detectors may be used in low-light conditions, where long integration times tend to be unacceptable. This applies to, e.g., X-ray screens, imagers for spectroscopy or distance imaging. There, the lateral drift-field photodetector (LDPD) sensors are advantageous, which will now be described in more detail and wherein a lateral electric field is introduced which accelerates the transfer process of photogenerated charges into the storage and readout node—e.g. a floating diffusion.[1] For generating this lateral drift field, which is formed by a doping gradient, windows which become increasingly large (toward the storage node) are formed in the mask used for structuring the implantation. On account of temperature steps during processing, the implanted dopants diffuse and thus generate a continuous gradient.[1,2] In this approach of producing drift fields into photodetectors, transfer times of a few nanoseconds were achieved for pixels having pixel sizes of 40 μm×40 μm.[3,4]

Figure 11:
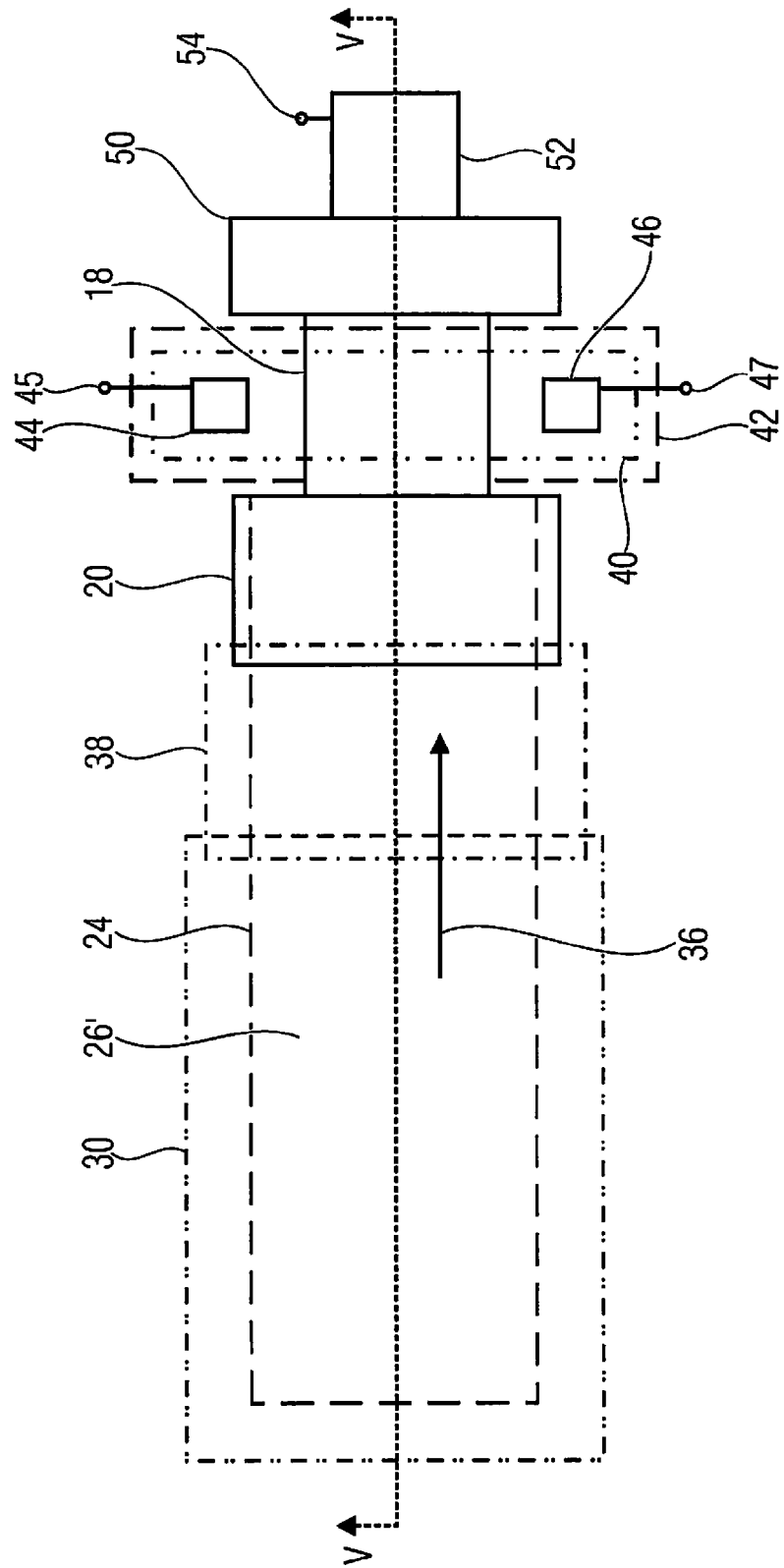
FIG. 11 shows a top view of a semiconductor structure having an LDPD with an integrated JFET readout structure in accordance with an embodiment.
Figure 12:
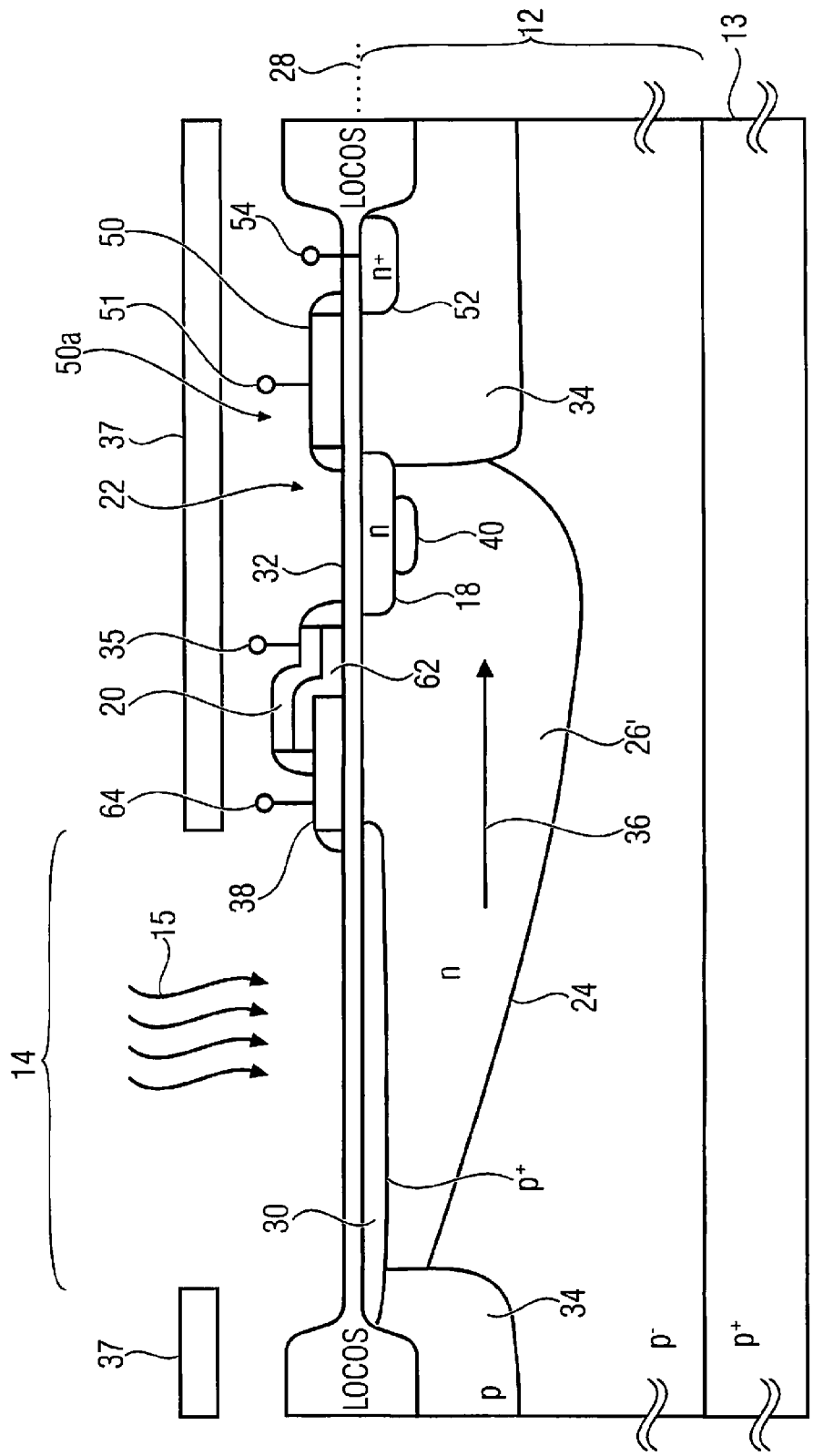
FIG. 12 shows a cross-sectional view along a sectional plane V-V in FIG. 11.

With reference to FIGS. 11 and 12, an embodiment of an LDPD semiconductor structure will be described next; as in the preceding figures, provision of elements with reference numerals that were already used before will mean that preceding descriptions relating to said elements shall also apply to these figures, so that in this manner, repeated descriptions of all of the elements are avoided. Rather, the following description is mainly limited to the differences in relation to the preceding description regarding the PPD.

Figure 8:
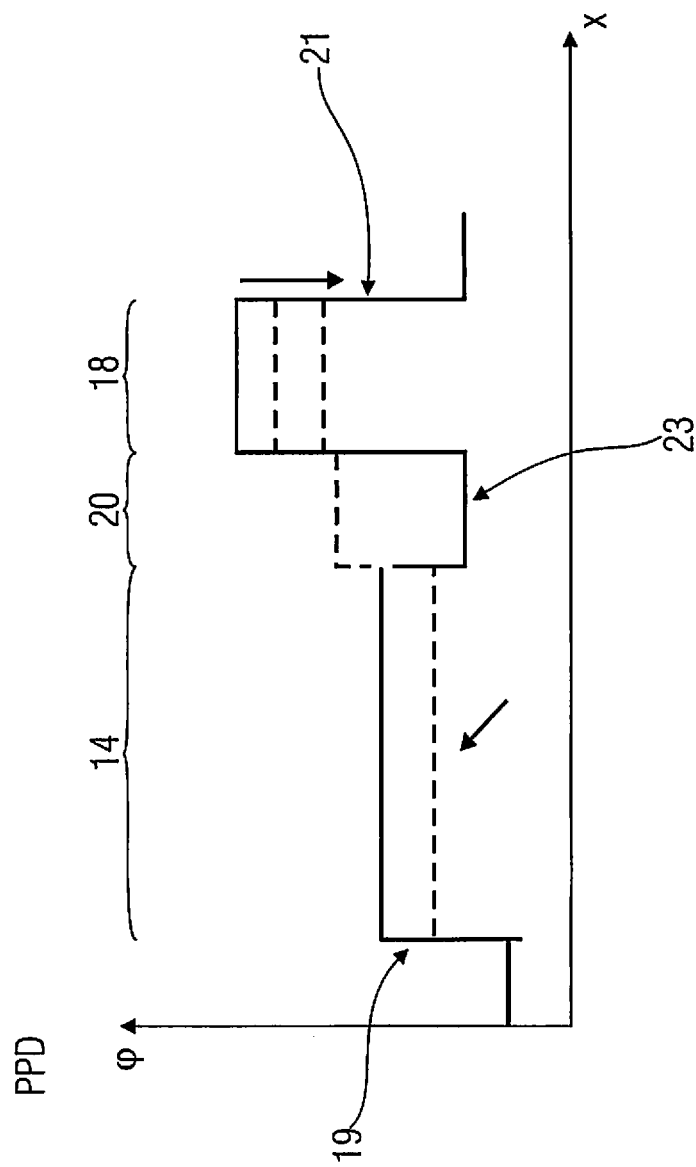
FIG. 8 shows a potential curve in the semiconductor structure of FIG. 5.
Figure 13:
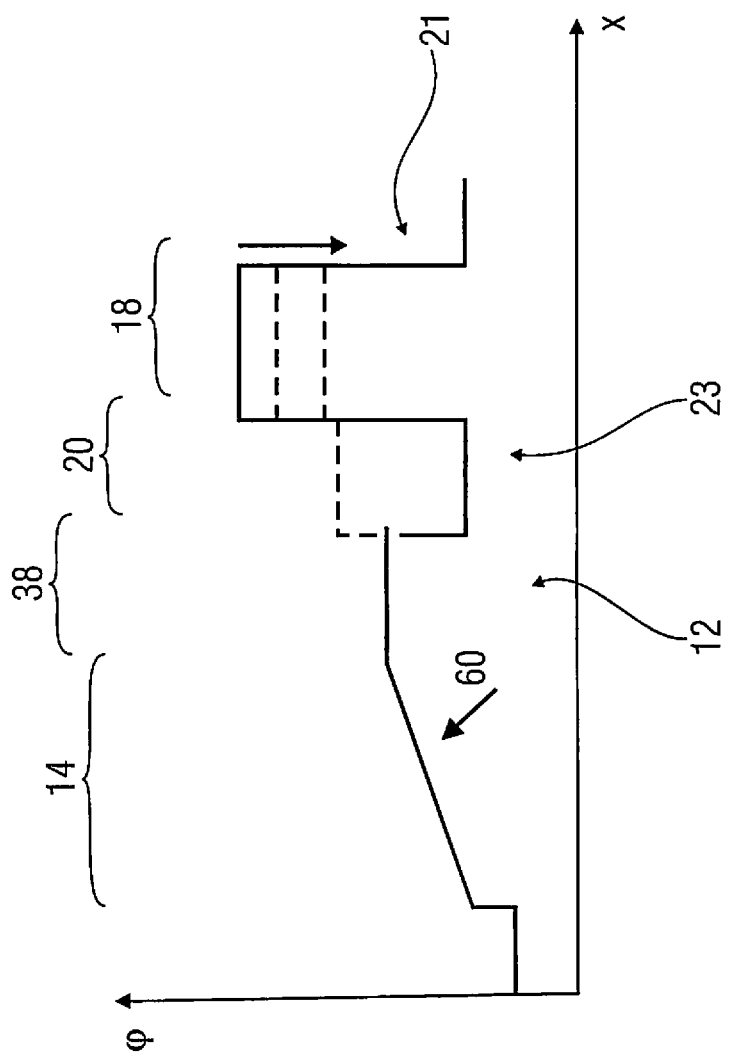
FIG. 13 shows a potential profile of the semiconductor structure of FIG. 11.

Unlike the preceding embodiments of FIGS. 5-9, FIGS. 11 and 12 show a semiconductor structure wherein the well 26' of the n conductivity type extends up to the n region 18 serving as the storage node and comprises a potential profile which, as is shown in FIG. 13, generates a drift field 60. In particular, in accordance with the doping profile of the well 26', a doping concentration of the well 26' increases up to the region 18, but remains smaller than a doping concentration of the region 18 itself. Just like in FIG. 8, FIG. 13 depicts, with a continuous line, the switched-off state of the transfer gate 20, i.e. non-transfer phase, whereas the dashed line represents the switched-on state, i.e. the transfer phase. As may be seen, the transfer gate 20 continues to define, when switched off, the potential barrier 23 between the potential well in the node 18 and the potential well 19 wherein the photogenerated charges of the zone 14 may accumulate by the drift field 60, namely on that side of the photoactive region which faces the transfer gate 20.

As is also shown in FIGS. 11 and 12, a collection gate 38 is arranged—such that it overlaps with the transfer gate 20 or laterally abuts same—along the drift current direction 36 and closer to the first potential well 19 so as to enable a potential reduction and a potential increase, which are separated from the transfer gate 20, between the potential wells 19 and 21. The collection gate 38 is also formed of polysilicon, for example, and is separated from the surface 28 via the insulating layer 32. As may well be seen in FIG. 12, the collection gate 38 may be, e.g., part of a structured polysilicon layer of which the reset gate 50 is also formed, for example; the polysilicon of the transfer gate 20 may be part of a further polysilicon layer which may be separated, e.g., from the first polysilicon layer of the collection gate 38 by an insulating layer, such as an oxide or a different dielectric 62, for example. The CMOS circuit into which the semiconductor structure of FIGS. 11 and 12 is integrated, and/or the CMOS process method by means of which same is produced, thus provides, by way of example, e.g. a layer sequence which comprises, above the insulating layer 32, two polysilicon layers separated by an insulating layer and followed by the metal planes already mentioned above. It is via the latter metal planes that the collection gate connection 64, which is schematically depicted in FIG. 12, can be connected to an evaluation circuit, such as the above-mentioned evaluation circuit, so as to be connected to a suitable potential.

The remaining terminals 35 for the transfer gates 20 and 51 for the reset gate 50 as well as the supply voltage terminal 54 may also be connected, via the corresponding conductor lines, to the corresponding evaluation circuit and/or the corresponding potential, as was already described above.

As was also already briefly explained above, the JFET structure of the JFET 22 essentially corresponds to that of the preceding embodiments, except that the channel area 40 may be embedded into the well 26' itself. Thus, the JFET 22 comprises a channel area 40 which adjoins the region 18, is embedded in the well 26' and comprises drain and source terminals 44 and 46 so as to form the JFET 22 along with the region 18. Routing of the channel area 40 and the arrangement and positions of the drain and source regions 44 and 46 as well as their contacting via terminals 45 and 47 remain the same, as was described above, i.e. with a current channel which forms such that it is transverse to the drift current direction.

In other words, the drain and source terminals 44, 46 of the JFET 22 may be located to be laterally opposite each other; i.e. in a top view, they are opposite each other across the region 18, specifically such that they adjoin the surface 28 and contacted, e.g., with a corresponding evaluation circuit through the insulating layer 32.

Integration of the JFET readout structure 22 is easier for an LDPD than for a PPD since a well embedding the channel 40 does already exist, namely the well 26' itself. This may be gathered from FIGS. 11 and 12.

Semiconductor structures of FIGS. 5 to 13 may be part of a pixel, which in turn may represent part of an array of pixels.

Figure 14:
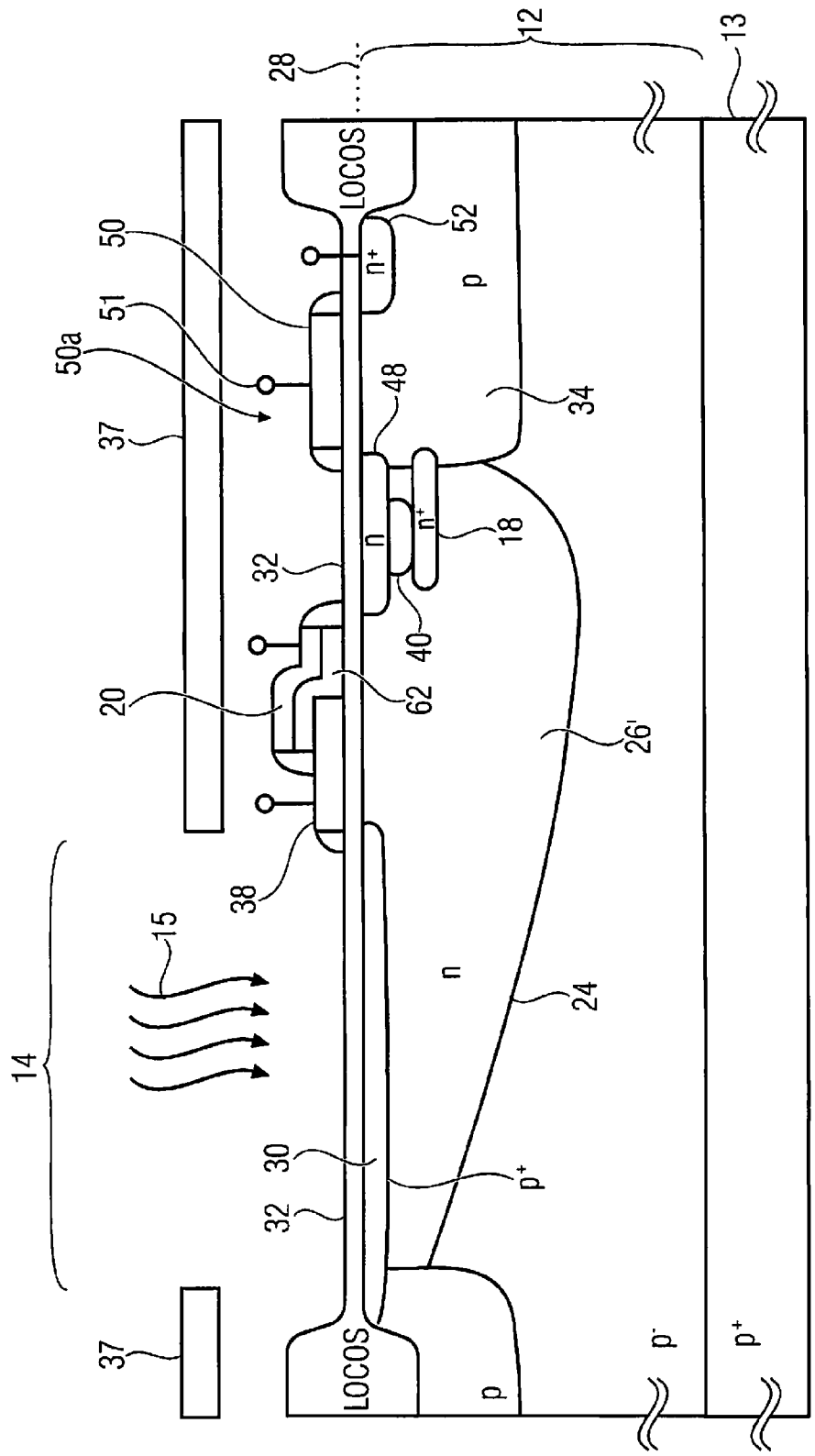
FIG. 14 shows a cross-sectional view along the sectional plane V-V of FIG. 11 in accordance with an alternative embodiment.

FIG. 14 represents the manner in which the potential maximum underneath the channel 40 may be defined in the case of suitable doping, which separates, in addition to the current-carrying channel 40, also the storage node 18 from the Si/SiO2 interface 28. Here, the reset transistor 50a is to be carefully designed so that same may drain charges from the buried storage node 18. The channel 40 may generally be fully or partly surrounded by more heavily doped n regions. In other words, FIG. 14 shows a semiconductor structure wherein the JFET 22 comprises a channel area 40 adjoining the region 28, the region 18 being spaced further apart from the insulating layer 32 than is a further region of the n conductivity type which is less heavily doped in comparison to the region 18; the channel area 40 extends—as viewed in the substrate thickness direction or in a lateral section—between the region 18 and the further region 48, from the drain terminal 44 of the JFET 22 to the source terminal 46 laterally spaced apart from the drain terminal 44, i.e. again such it is transverse to the transfer direction 36.

Figure 15:
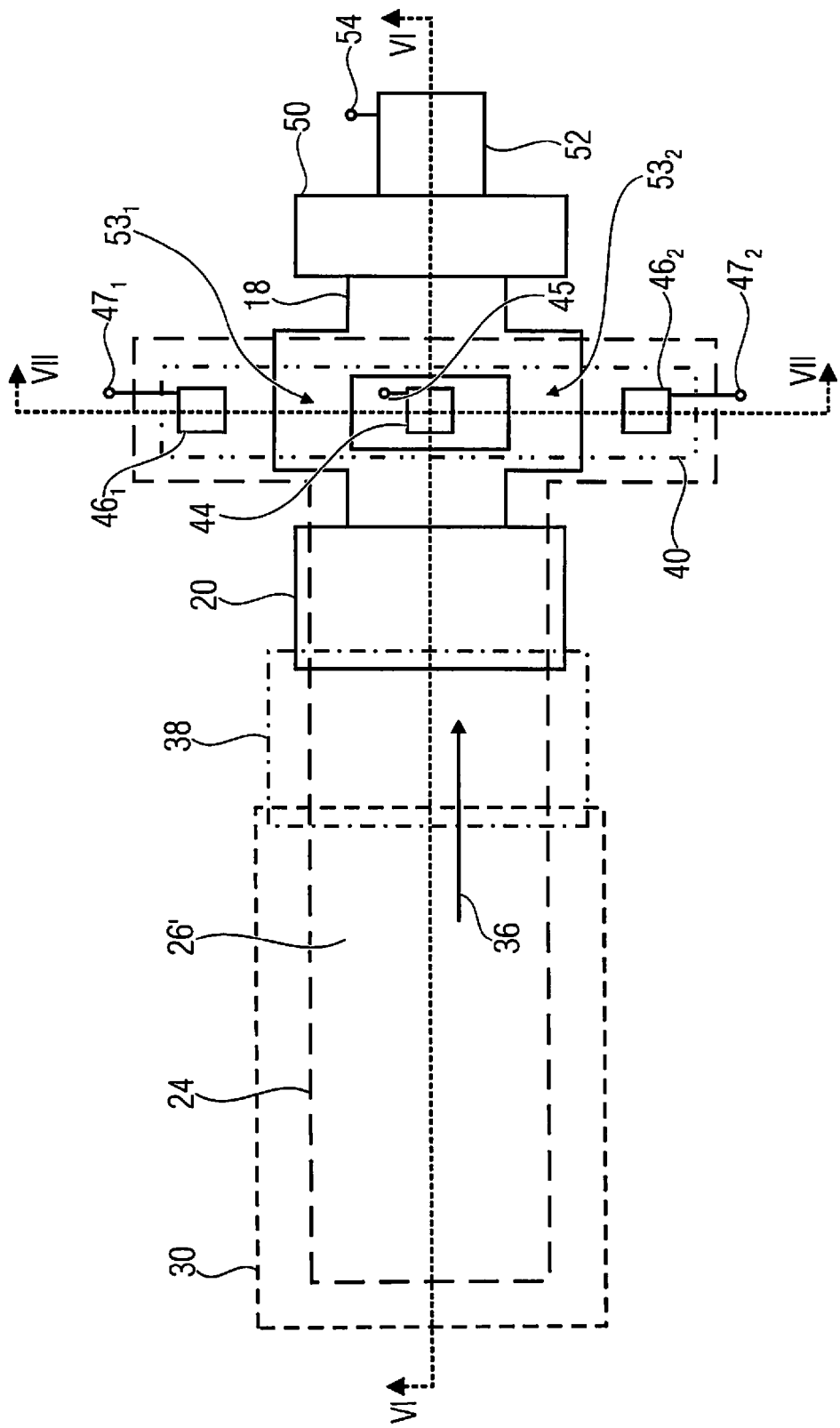
FIG. 15 shows a top view of a semiconductor structure comprising an LDPD with an integrated JFET readout structure in accordance with an alternative embodiment.
Figure 16:
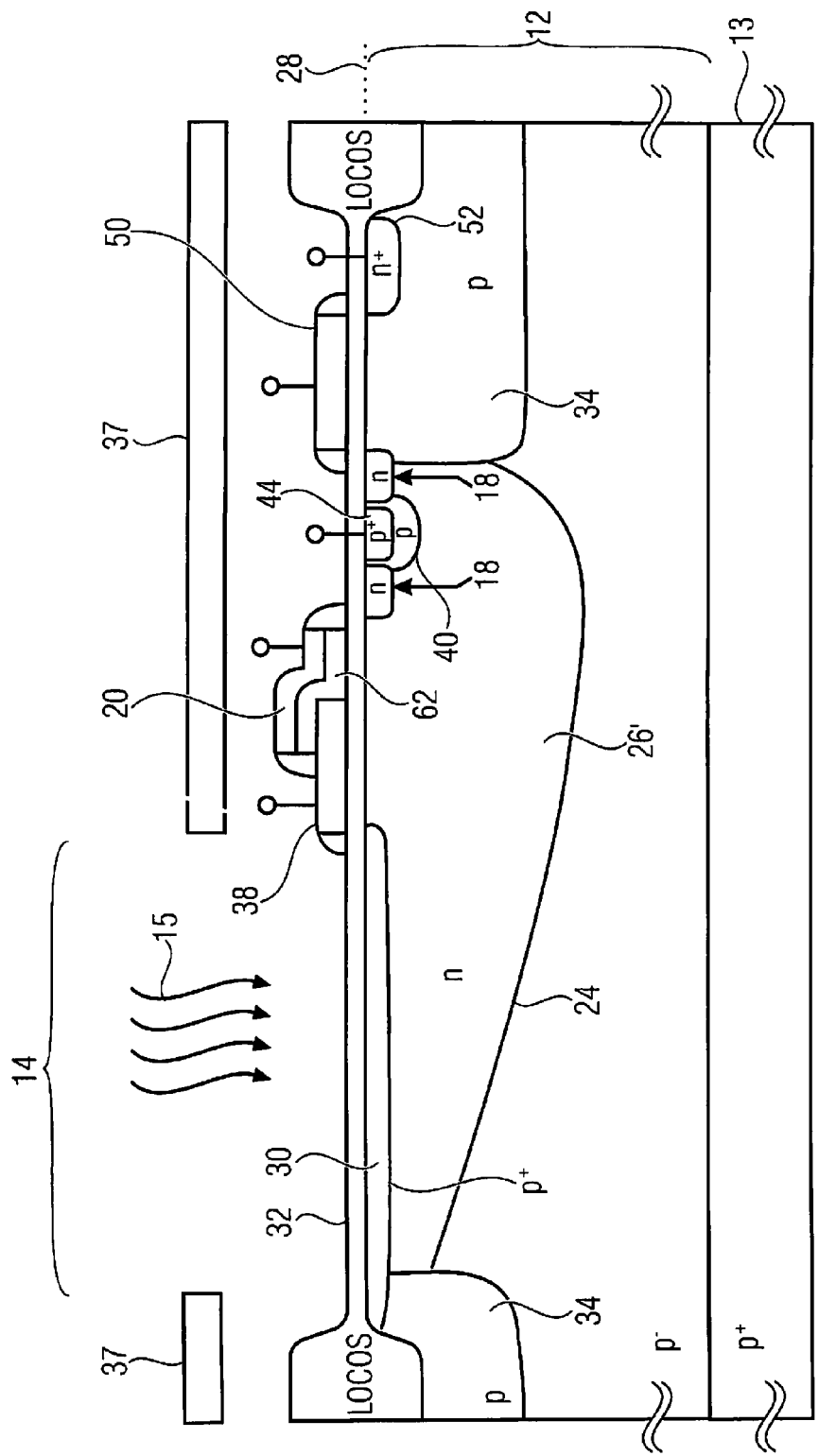
FIG. 16 shows a cross-sectional view along the sectional plane VI-VI of FIG. 15.
Figure 17:
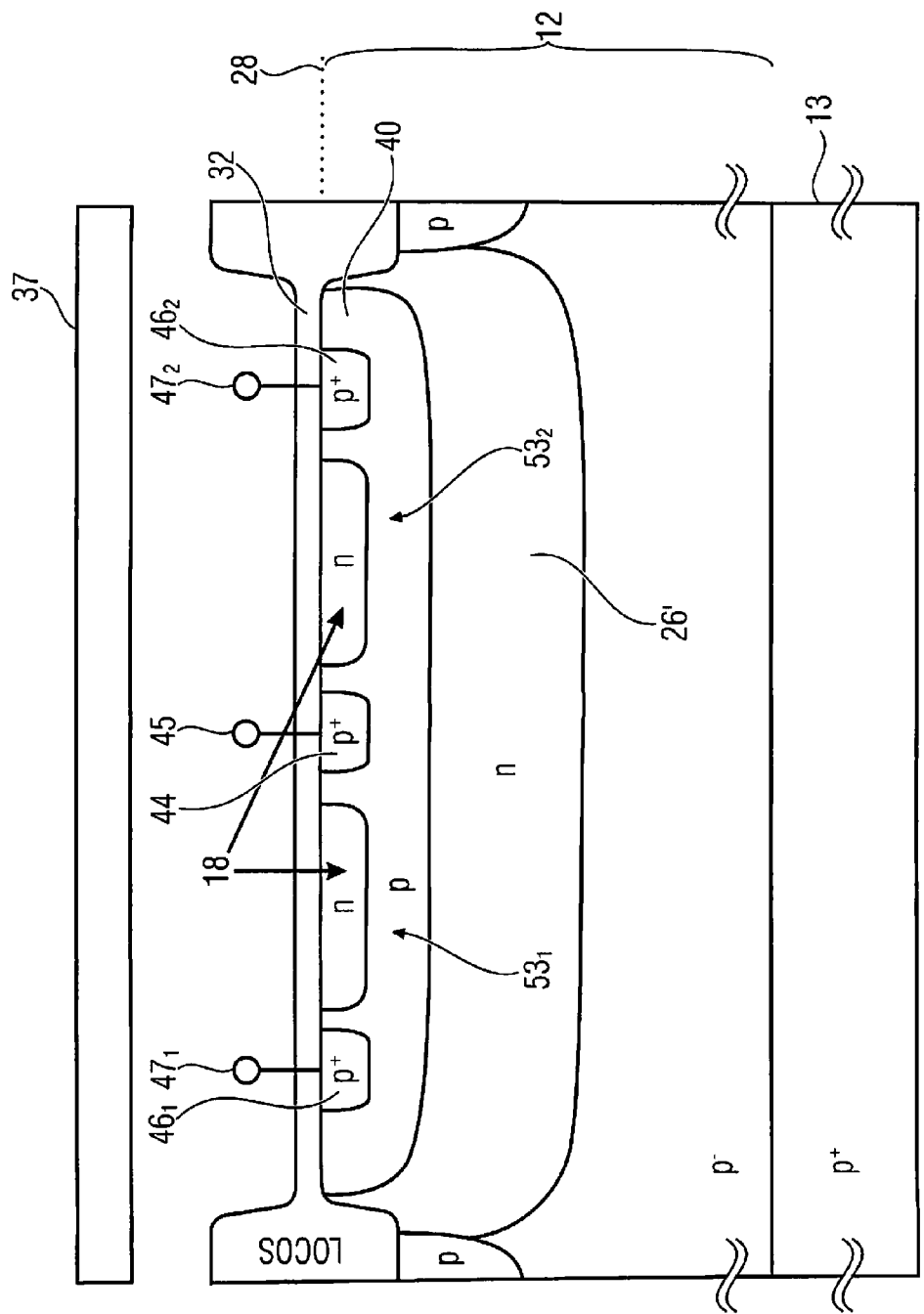
FIG. 17 shows a sectional view along the sectional plane VII-VII of FIG. 15.

In contrast to the variants depicted above, the structure depicted in FIGS. 15-17 forms two channel regions $53_{1,2}$, which may be reconnected via conductor lines, for example. By way of example, the centered electrode 44 is referred to by drain; however, a reverse designation is also possible. By means of this separation, a further variation of the sensitivity of the readout structure 22 is possible.

Figure 18:
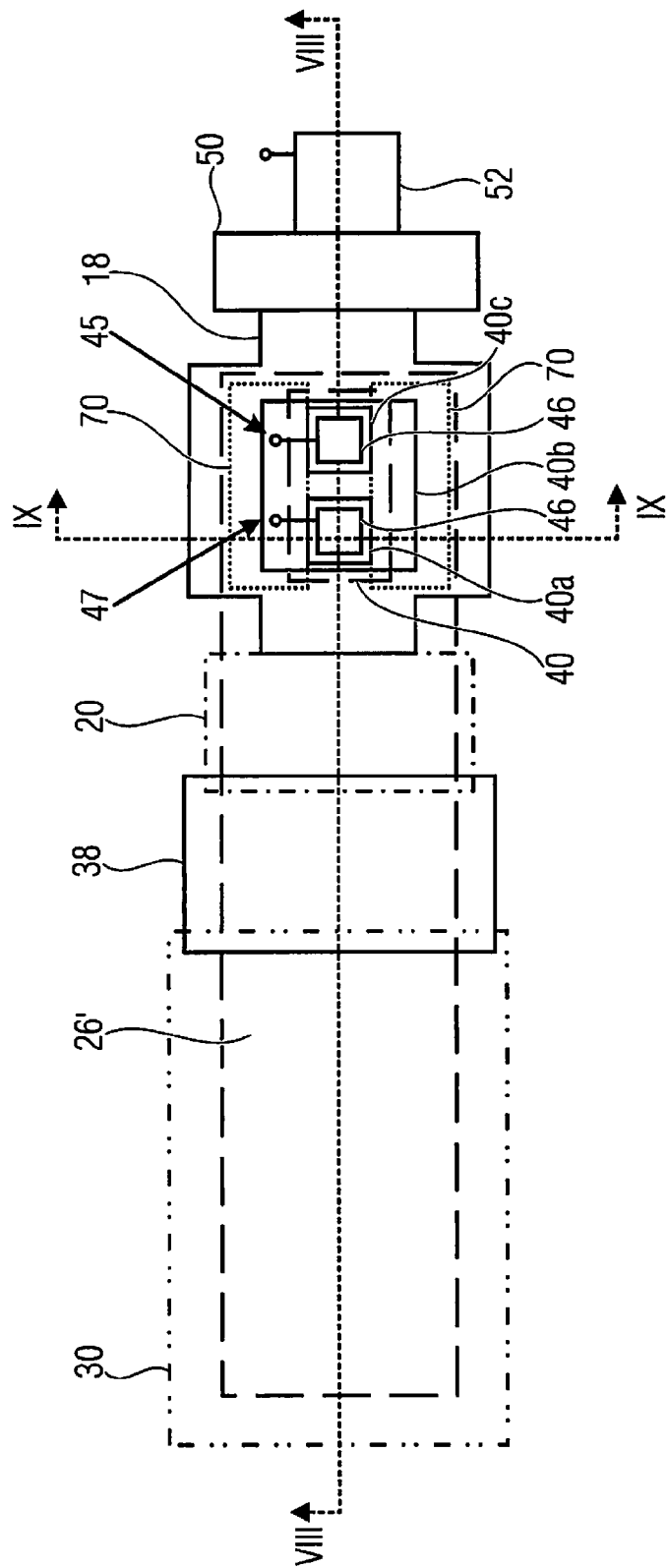
FIG. 18 shows a top view of a semiconductor structure comprising an LDPD with an integrated JFET readout structure in accordance with a further embodiment.
Figure 19:
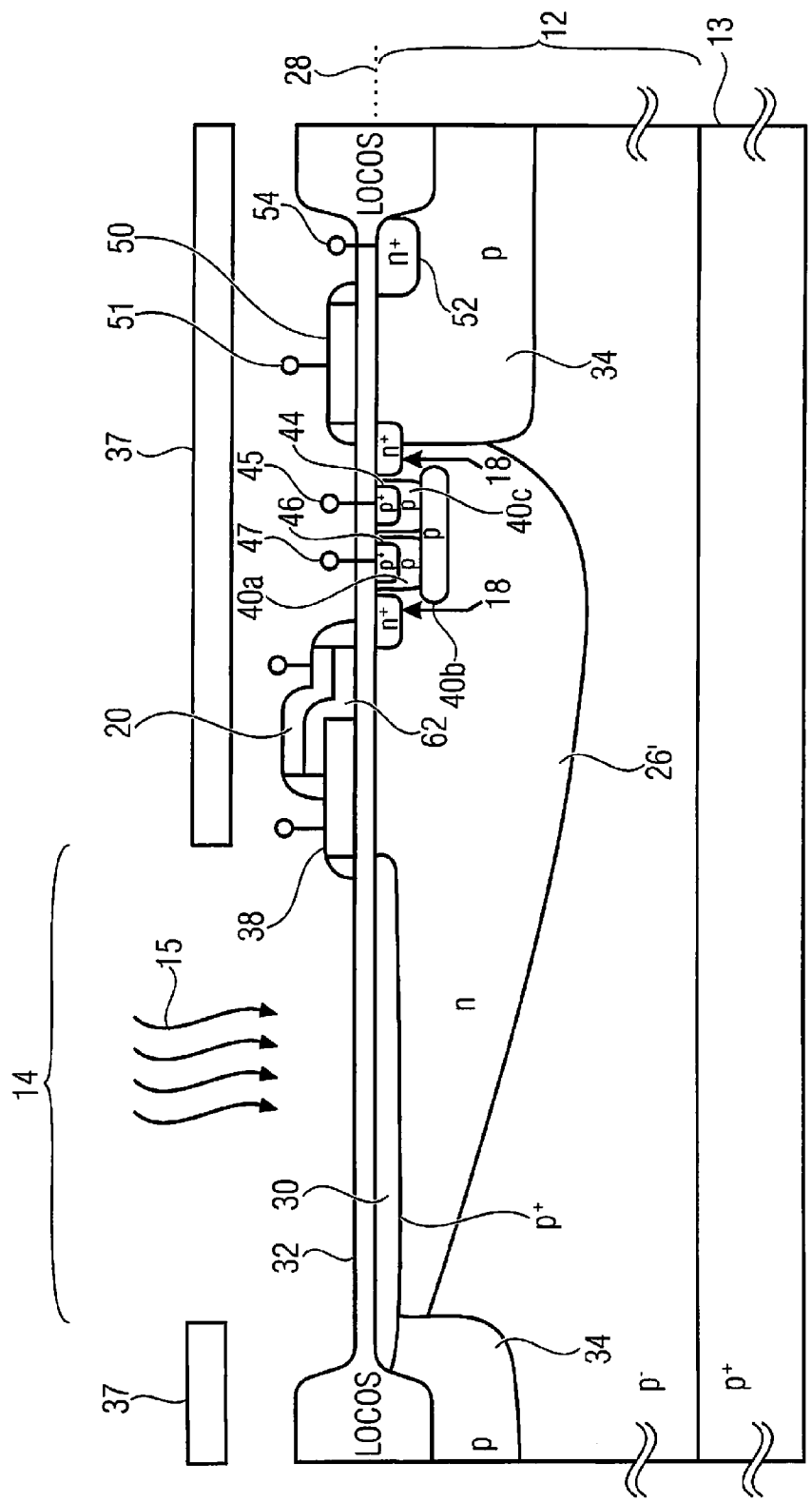
FIG. 19 shows a sectional view along the sectional plane VIII-VIII.
Figure 20:
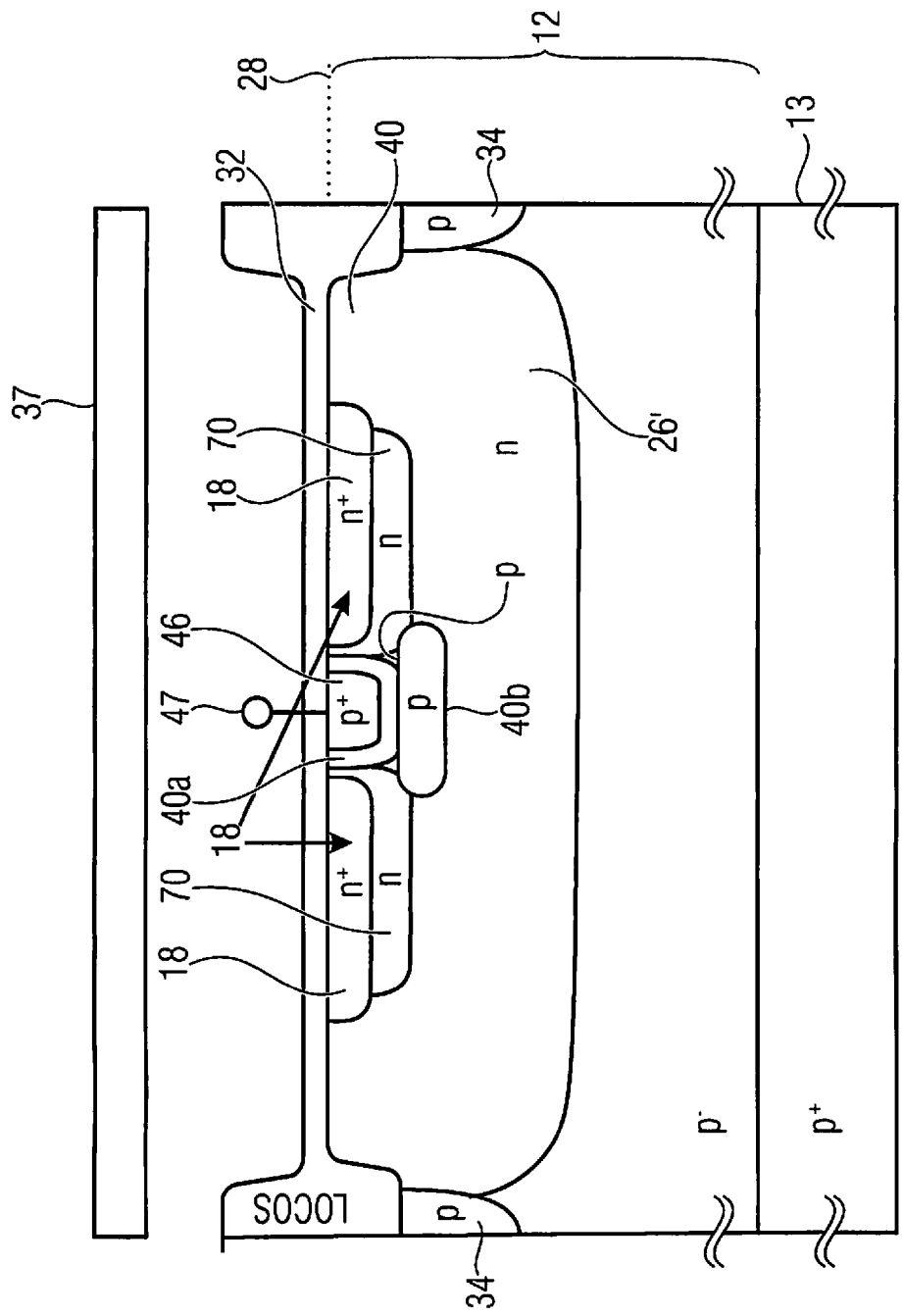
FIG. 20 shows a sectional view along the sectional plane IX-IX.

In the structures presented above, the current-carrying channel was configured to be lateral. The following FIGS. 18-20 represent an alternative JFET structure 22, which comprises a vertically configured channel region. Here, the current-carrying channel is modulated essentially by the floating diffusion 18 and any deep n implantations 70 rather than by the n-well surrounding the channel 40. However, the dopant concentrations may possibly have to be adapted to avoid punch-through, Zener or avalanche effects, which is indicated in the graphics.

The readout structure defined by the integrated JFET may be wired in various manners. For example, common source, common gate, common drain or similar circuits based on the JFET may be implemented. With regard to linearity and insensitivity to process variations, the source follower circuit—depicted in FIG. 21—represents a useful implementation possibility. Since the transconductance of the JFET is defined by implantations, which may possibly vary heavily across the pixel matrix, a less pronounced variation of the pixel properties within a matrix may be expected here.

It shall be pointed out once again that the above embodiments may also be varied, e.g. with regard to permutation of n and p conductivity types of the regions, to the implementation, such as to utilization of a material other than polysilicon for the gates, a different configuration of the p channel region 40 than a p implantation, and the like.

Figure 21:
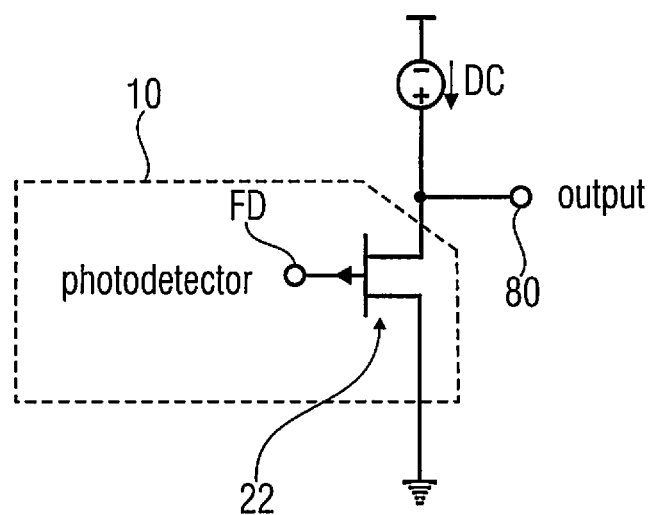
FIG. 21 shows an equivalent circuit diagram of a possible wiring of the JFET of the above embodiments in accordance with an embodiment.

As has been said, a multitude of readout circuits are generally possible which use the JFET structure shown. One possibility is depicted in FIG. 21. The output 80 shown there would be joined by a corresponding more far-reaching evaluation unit. Generally, the transistor 22 may be used for a common source circuit, common gate circuit or for differential amplifiers if a high level of sensitivity is needed.

Figures 22A, 22B:
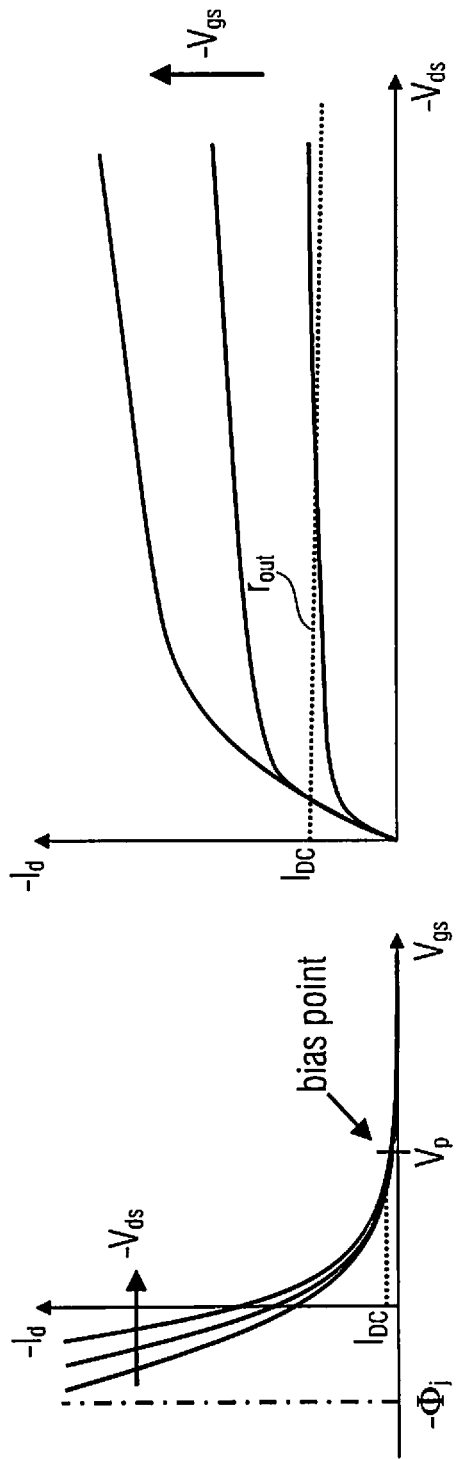
FIG. 22a shows a transfer characteristic of the JFET of FIG. 21.
FIG. 22b shows an output characteristic of the WET of FIG. 21.

Since implantations may not be metered with the same intensity as gate oxides, for example, the transconductance may vary strongly in said circuits. A source follower implementation exhibits a less pronounced variation since—when assuming a sufficiently pronounced transconductance—the differential voltage amplification is not sensitive to same. As is shown in FIG. 21, the current flowing through the channel of the JFET 22 is set to a constant value by a peripheral circuitry. The circuit operates properly as long as the JFET 22 is in saturation and as long as the current is kept constant. FIG. 22a,b shows the mode of operation of the JFET.

The representation of the transfer characteristic in FIG. 22a shows that for a constant bias, the gate source current $V_{gs}$ is regulated such that it does not vary, so that there is only a minor sensitivity to $V_{ds}$. The value approximately corresponds to the pinch-off voltage. Therefore, it would be advantageous, for the purpose of achieving a large dynamic range, to configure the pinch-off voltage to be approximately equal to zero. A sufficiently negative bias of $V_{gs}$ would operate the p/n junction, which acts as a gate, in the forward direction, which is to be avoided. In addition, it is interesting to ascertain that the JFET 22 already exhibits a high linearity for a high reset potential at the floating diffusion 18. This also applies to small signals. For a buried NMOS transistor having a negative threshold voltage and operating as a source follower, this circumstance would create restrictions of the reset potential for the floating diffusion. This is not the case in the JFET implementation. The output characteristic shown in FIG. 22b indicates the operating point adjustment with a current source. The output resistance of the latter and the supply current define the operating point. Since $V_{gs}$ is kept approximately constant, the output characteristic and the bias current for a large voltage range of $V_{ds}$ will be approximately the same if the drain current of the JFET exhibits low $V_{ds}$ dependence at saturation. This defines the output voltage swing for which the device operates at saturation, or, in other words, the circuit offers a high level of linearity.

Evidently, a low pinch-off voltage is regarded as being significant for the operation of a source follower. Since the voltage range for $V_{gs}$ is limited by the diffusion voltage $\Phi_j$ of the bias/p-n junction and of the pinch-off voltage $V_p$, this may be different for other amplifiers. If the doping concentration of the n$^+$ bias diffusion is high as compared to the n-well embedding the p channel of the JFET, one may assume that the channel modulation is performed merely by the upper p/n junction. A simplifying assumption of an abrupt junction results in the following equation for the pinch-off voltage:[22]

$$V_p = \frac{q \cdot N_A \cdot a^2}{2 \cdot \varepsilon_{Si}} - \frac{kT}{q} \cdot \ln\left(\frac{N_A \cdot N_D}{n_i^2}\right),$$

wherein q is the elementary charge, T is the absolute temperature, k stands for the Boltzmann constant, $N_A$ equals the p channel doping concentration, i.e. of channel 40, $N_D$ is the n$^+$ doping concentration, i.e. of the region 52, $n_i$ equals the intrinsic carrier concentration, a represents the channel depth, and $\varepsilon_{Si}$ is the dielectricity constant of silicon. Since useful doping concentrations for the channel 40 should be lower than the n$^+$ donator concentration, but higher than the concentration of the well 26' and 42, respectively, channel depths should be selected to have only a few hundred nanometers in order to achieve a low pinch-off voltage. This predestines an implantation at the far end of the processing for a JFET designed for source follower operation.

In addition, it is interesting to ascertain that FIG. 21 reveals that, in contrast to common APS pixels, no conductor line is needed for a positive supply voltage in the structure. The filling factor may therefore be increased by eliminating the associated wiring. Alternatively, the space may be used for arranging broader and more low-impedance conductor lines so as to avoid voltage drops and parasitic coupling.

An exemplary layout of an LDPD designed for an 0.35 μm CMOS process enabled a pixel size of 13.34×40 μm$^2$, which is sufficient for many applications. In this context, two draining gates were applied to the collection gate such that they were perpendicular to the charge transfer direction 36. The floating diffusion 18 subsequently was extended across the p channel and contacted with a PMOS transistor for resetting. An NMOS transistor was selected for a row-select switch. The filling factor for this pixel is approximately 35%. Technology CAD simulation verified the manufacturability of the device and its mode of operation.

Thus, JFET structures were shown which may be implemented for PPDs and LDPDs, for example. Ideally, no modifications are necessary for CMOS processes which already offer PPD or LDPD detectors. The proposed low-noise readout structure was explained, which was followed by an explanation of how the noise is reduced. A description was given of how doping concentrations and device geometry may be designed to yield the best performance. To verify the proposed readout structure, technology CAD simulations were performed, which matched the theory.

The above embodiments may be used for obtaining APS pixel structures having an improved dynamic range, for example as a photodetector in sophisticated image sensors such as time-of-flight sensors or image sensors for automotive applications. In some of the above embodiments, this was obtained by means of an improved unipolar readout structure, which is superior to the commonly used source follower readout implemented by enhancement MOSFETs. Said improved unipolar readout structure provides a high output voltage swing and low noise while requiring no additional processing steps. The readout structure may consist of a low-noise JFET, the gates of which are formed by a floating diffusion, whereby in-pixel accumulation capability is preserved—which additionally improves the noise performance. This structure exceeds the performance of a simple in-pixel implementation of a JFET and of a photodetector with regard to the space requirement, and thus improves the filling factor. For pixels having center-to-center distances of several micrometers, this readout structure is a good tradeoff between the surface area that may be used, output voltage swing and, most importantly, noise performance. Since merely one earth connection may be used for application, interferences regarding the filling factor and the current supply network, such as a DC voltage drop, for example, may additionally be improved.

What has been presented is a low-noise readout structure which is applicable, e.g., to PPDs or LDPDs and which may be implemented in CMOS processes by adding no or only few process modifications. It has been shown how the proposed structure reduces noise and how it may be implemented in CMOS processes which already exhibit an improvement regarding image capture. It has also been shown how such a readout structure may be implemented with only minor modifications, if any, in a CMOS process.

Thus, the above embodiments described, among other things, a semiconductor structure 10 having a semiconductor layer 12 of a first conductivity type and a first photosensitive zone 14 configured such that photogenerated charges may be produced and collected in a first potential well, such as during an accumulation phase. However, the photosensitive zone 14 need not necessarily be formed, as is the case in the preceding embodiments, by a p-n photodiode 16 in a fairly limited sense, said p-n photodiode 16 being configured such that photogenerated charges may be accumulated in the first potential well 19. With the PPD, the accumulation of the charge carriers in the first potential well formed an inherently occurring process in the PPD, and the transfer gate merely enabled draining of the accumulated charges, whereas with the LDPD, the transfer gate contributes to defining, during the non-transfer phase, the first potential well. However, the photosensitive zone may also be a photogate or a buried photogate.

In addition, the semiconductor structure 10 includes a region 18, formed in the semiconductor layer 12, of the second conductivity type which is complementary to the first conductivity type, for temporarily storing the photogenerated charges in a second potential well, such as up to a readout phase following, e.g., the accumulation phase. Moreover, the semiconductor structure 10 includes a transfer gate 20 between the region 18 of the second conductivity type and the photosensitive zone 14 for defining a potential barrier between the first and second potential wells during a non-transfer phase and for eliminating the potential barrier between the first and second potential wells during a transfer phase. In other words, a first potential may optionally be applied to the transfer gate 20 between the region 18 of the second conductivity type and the photosensitive zone 14, so that a potential barrier is defined between the first and second potential wells, and a second potential, which differs from the first potential, may be applied, so that the potential barrier between the first and second potential wells is eliminated. The non-transfer phase may correspond to the accumulation phase, for example, and the transfer phase may be between the accumulation phase and the readout phase, for example. However, the transfer phase may also occur during the accumulation phase, so that direct readout is possible in the event of elimination of the potential barrier. Moreover, the semiconductor structure 10 includes a readout structure for reading out the temporarily stored photogenerated charges, such as during the readout phase, the readout structure including a JFET 22, the gate of which is formed by the region 18 of the second conductivity type. A schematic view of the potential curve with the potential wells is shown in FIG. 8 by way of example.

The semiconductor structure p-n photodiode 16 may comprise a p-n junction 24, buried in the semiconductor layer, between a well 26, 26' of the second conductivity type which is formed in the semiconductor layer 12 and a surrounding, adjoining portion of the semiconductor layer 12. The well 26, 26' of the second conductivity type in the photosensitive zone 14 at a front side 28 of the semiconductor layer 12 may be covered by a layered semiconductor area 30 of the first conductivity type, which has a higher doping concentration that the semiconductor layer 12 and 26, so that the first potential well is spaced apart from an insulating layer 32 at the front side 28 of the semiconductor layer 12 via which the transfer gate 20 is insulated from the semiconductor layer 12. The front side need not correspond to the side of the irradiation. Rather, it corresponds to the side of the structuring of components. Additionally or alternatively, the region 18 of the second conductivity type may comprise a higher doping concentration than the well 26, 26' of the second conductivity type. Also additionally or alternatively, the well 26 of the second conductivity type may extend to below the transfer gate 20 so as to there adjoin a well 34 of the first conductivity type which has a higher doping concentration than a doping concentration of the semiconductor layer 12, the well 34 of the first conductivity type having the region 18 of the second conductivity type and the JFET 22 embedded therein. The JFET 22 may comprise a channel area 40 of the first conductivity type which adjoins the region of the second conductivity type, is embedded in a further well 42 of the second conductivity type, and comprises a drain terminal 44 and a source terminal 46 so as to form the WET 22 together with the region 18 of the second conductivity type. In this context, the channel area 40 of the first conductivity type may extend laterally to a drift current direction 36, along which the photogenerated charges move from the first potential well into the second potential well during the transfer phase.

In addition, it is possible for the semiconductor structure p-n photodiode 16 to comprise a p-n junction 24, buried in the semiconductor layer, between a well 26, 26' of the second conductivity type which is formed in the semiconductor layer 12 and a surrounding, adjoining portion of the semiconductor layer 12, the well 26' of the second conductivity type extending as far as to the region 18 of the second conductivity type and comprising a doping profile, according to which a doping concentration of the well 26' of the second conductivity type increases toward the region 18 of the second conductivity type but is smaller than a doping concentration of the region 18 of the second conductivity type.

Along a drift current direction 36, along which the photogenerated charges move from the first potential well into the second potential well during the transfer phase, a collection gate 38 may be arranged—such that it overlaps with the transfer gate 20 or laterally abuts same—closer to the first potential well so as to enable a potential reduction and a potential increase between the first potential well and the second potential well. The JFET (22) may comprise a channel area (40) of the first conductivity type which adjoins the region (18) of the second conductivity type and which is embedded in the well (26') of the second conductivity type, comprises a drain terminal and a source terminal so as to form the JFET together with the region of the second conductivity type. Alternatively, it is possible for the JFET 22 to comprise a channel area 40 of the first conductivity type which adjoins the region 18 of the second conductivity type, the region 18 of the second conductivity type being spaced further apart from an insulating layer 32, via which the transfer gate 20 is insulated from the semiconductor layer 12, than is a further region 48 of the second conductivity type which is less heavily doped in comparison to the region 18 of the second conductivity type, the channel area 40 of the first conductivity type extending vertically (i.e. seen in a lateral section) between the region 18 of the second conductivity type and the further region 48 of the second conductivity type, from a drain terminal 44 of the JFET 22 to a source terminal 46 of the WET 22 which is laterally spaced apart from the drain terminal 44. The drain terminal and the source terminal of the JFET may be located laterally (i.e. as seen in a top view) opposite each other across the region of the second conductivity type. The channel area 40 of the first conductivity type may extend in a lateral direction in a manner transverse to a drift current direction 36 along which the photogenerated charges move from the first potential well into the second potential well during the transfer phase.

The JFET 22 may comprise a channel 40a, 40b, 40c of the first conductivity type which vertically and effectively extends past the region 18 of the second conductivity type and which extends between a drain terminal 44 of the JFET and a source terminal 46 of the JFET, said source terminal 46 being laterally spaced apart from the drain terminal 44.

The JFET 22 may be part of a common source circuit, common gate circuit, common drain circuit or part of the input stage of a differential amplifier.

The region 18 of the second conductivity type may further be coupleable to a supply potential terminal via a reset gate 50.

The semiconductor structure may be implemented in CMOS.

The photoactive region may be linked to at least one collection gate 38 which is adjoined by at least one transfer gate 20 to which the region 18 may be read out via a JFET structure 22.

The photosensitive zone 14 and/or a collection gate 38 may be connected, via several transfer gates 20, to regions 18 which are connected at least partly to JFET readout structures 22.

With regard to a possible method of producing such a semiconductor structure, a description was given above stating that it is possible that the method of producing the channel area of the first conductivity type comprises a channel threshold voltage implantation, a drain extension implantation, or a halo implantation, or that for producing the drain and source terminals (44, 46), an implantation through the insulating layer (32) is used, or that for separating the diffusions of the drain and source terminals (44, 46), LOCOS or STI is used, or that for generating the further well (42) of the second conductivity type, an implantation process step for producing the well (26) of the second conductivity type, an implantation process step for producing a PMOSFET or a channel threshold voltage implantation process step is employed. In particular, a method of producing a semiconductor structure may be implemented in CMOS, in accordance with an embodiment.

A method of operating a semiconductor structure 10 comprising a semiconductor layer 12 of a first conductivity type, a photosensitive zone 14 formed by a p-n photodiode 16 formed in the semiconductor layer 12 and configured to accumulate photogenerated charges in a first potential well, and a region 18 of the second conductivity type, formed in the semiconductor layer 12, for temporarily storing the photogenerated charges in a second potential well up to a readout phase, may comprise the following steps: controlling a transfer gate 20 between the region 18 of the second conductivity type and the photosensitive zone 14, for defining a potential barrier between the first and second potential wells, such as during the accumulation phase, and eliminating the potential barrier between the first and second potential wells during a transfer phase which, as was already mentioned, may lie between the accumulation phase and the readout phase, but may also coincide with the accumulation phase so as to simultaneously enable accumulation and transfer; and reading out the temporarily stored photogenerated charges during the readout phase by means of a WET 22, the gate of which is formed by the region 18 of the second conductivity type.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] Durini, D., Spickermann, A., Mandi, R., Brockherde, W., Vogt, H., Grabmaier, A., and Hosticka, B. J., "Lateral drift-field photodiode for low noise, high-speed, large photoactive-area CMOS imaging applications", *Nuclear Instruments and Methods in Physics Research Section A: Accelerators, Spectrometers, Detectors and Associated Equipment* 624, 470-475 (December 2010).

[2] Mandi, R., Fink, J., and Hosticka, B. J., "Lateral Drift-Field photodetector for high speed 0.35 μm CMOS imaging sensors based on non-uniform lateral doping profile: Design, theoretical concepts, and TCAD simulations", in [*Research in Microelectronics and Electronics (PRIME)*, 2010 Conference on Ph.D], 1-4, IEEE (July 2010).

[3] Spickermann, A., Durini, D., Suss, A., Ulfig, W., Brockherde, W., Hosticka, B. J., Schwope, S., and Grabmaier, A., "CMOS 3D image sensor based on pulse modulated time-of-flight principle and intrinsic lateral drift-field photodiode pixels", in [*ESSCIRC (ESSCIRC)*, 2011 Proceedings of the], 111-114, IEEE (September 2011).

[4] Durini, D., Spickermann, A., Fink, J., Brockherde, W., Grabmaier, A., and Hosticka, B., "Experimental Comparison of Four Different, CMOS Pixel Architectures Used in Indirect Time-of-Flight Distance Measurement Sensors", in [2011 *International Image Sensor Workshop (IISW)*], IEEE (2011).

[5] Inoue, L, Nozaki, H., Yamashita, H., Yamaguchi, T., Ishiwata, H., Ihara, H., Miyagawa, R., Miura, H., Nakamura, N., Egawa, Y., and Matsunaga, Y., "New LV-BPD (low voltage buried photo-diode) for CMOS imager", in [*Electron Devices Meeting*, 1999. IEDM Technical Digest. International], 883-886, IEEE (1999).

[6] Inoue, L, Tanaka, N., Yamashita, II., Yamaguchi, T., Ishiwata, H., and Ihara, H., "Low-leakage-current and low-operating-voltage buried photodiode for a CMOS imager", *IEEE Transactions on Electron Devices* 50, 43-47 (January 2003).

[7] Fossum, E. R., "Active Pixel Sensors: Are CCD's Dinosaurs?", in [*Proceedings of SPIE* (1990)], 1900, 2-14, SPIE (1993).

[8] Fossum, E. R., "Digital camera System on a chip", in [*Micro, IEEE*], 18, 8-15, IEEE (May/June 1998).

[9] Theuwissen, A., "CMOS image sensors: State-of-the-art and future perspectives", in [*Solid State Circuits Conference, 2007. ESSCIRC 2007. 33rd European*], 21-27, IEEE (September 2007).

[10] Lustica, A., "CCD and CMOS image sensors in new HD cameras", in [*ELMAR, 2011 Proceedings*], 133-136, IEEE (September 2011).

[11] Pain, B., Cunningham, T., Hancock, B., Wrigley, C., and Sun, C., "Excess noise and dark current mechanisms in CMOS imagers", in [*IEEE Workshop on CCD and Advanced Image Sensor*], 145-148 (June 2005).

[12] White, M. H., Lampe, D. R., Blaha, F. C., and Mack, I. A., "Characterization of surface channel CCD image arrays at low light levels", *IEEE Journal of Solid-State Circuits* 9, 1-12 (February 1974).

[13] Kim, J., Hwang, S., Lee, J., Ko, J., Kim, Y., Ahn, J., Asaba, T., and Lee, Y., "Characterization and improvement of random noise in ⅓.2″ UXGA CMOS image sensor with 2.8 um pixel using 0.13 um-Technology," in [*Proc. IEEE Workshop CCDs Adv. Image Sens.*], 149-152 (June 2005).

[14] Wang, X., Rao, P. R., Mierop, A., and Theuwissen, A. J., "Random telegraph signal in CMOS image sensor pixels", in [*Electron Devices Meeting*, 2006. IEDM '06. International], 1-4, IEEE (December 2006).

[15] McWorther, A. L., 1/f *noise and related surface effects in germanium*, PhD thesis, MIT, Boston (1955).

[16] Martin-Gonthier, P. and Magnan, P., "Novel readout circuit architecture for CMOS image sensors minimizing RTS noise", *IEEE Electron Device Letters* 32, 776-778 (June 2011).

[17] Lahav, A., Veigner, D., Fenigstein, A., and Shiwalkar, A., "Optimization of random telegraph noise non uniformity in a CMOS pixel with a pinned-photodiode", in [*Proc. Int. Image Sens. Workshop* 2007], pp. 230-234 (June 2007).

[18] Martin-Gonthier, P. and Magnan, P., "RTS noise impact in CMOS image sensors readout circuit", in [16*th IEEE International Conference on Electronics, Circuits, and Systems*, 2009. ICECS 2009], 928-931, IEEE (December 2009).

[19] Martin-Gonthier, P., Havard, E., and Magnan, P., "Custom transistor layout design techniques for random telegraph signal noise reduction in CMOS image sensors", *Electronics Letters* 46, 1323-1324 (September 2010).

[20] Saks, N. S. and Ancona, M. G., "Spatial uniformity of interface trap distribution in MOSFETs", IEEE Transaction on Electron Devices, 1057-1063 (April 1990).

[21] Elewa, T., Kleveland, B., Cristoloveanu, S., Boukriss, B., and Chovet, A., "Detailed analysis of edge effects in SIMOX-MOS transistors", IEEE Transactions on Electron Devices, 874-882 (April 1992).

[22] Sze, S. and Ng, K. K., [*Physics of Semiconductor Devices*], John Wiley & Sons, third edition

[23] Motchenbacher, C. D. and Connelly, J. A., [*Low-Noise Electronic System Design*], John Wiley & Sons.

[24] Vittoz, E. A., "MOS transistors operated in the lateral bipolar mode and their application in CMOS technology", *IEEE Journal of Solid-State Circuits* 18, 273-279 (June 1983).

[25] Roks, E., Centen, P. G., Sankaranarayanan, L., Slotboom, J. W., Bosiers, J. T., and Huinink, W. F., "A bipolar floating base detector (FBD) for CCD image sensors", in [*IEDM '92*], pp. 109-112 (1992).

[26] Brewer, R. J., "A low noise CCD Output amplifier", in [*Electron Devices Meeting,* 1978 International], 24, 610-612, IEEE (1978).

[27] Brewer, R. J., "The low light level potential of a CCD imaging array", *IEEE Transactions on Electron Devices* 27, 401-405 (February 1980).

[28] Roks, E., Centen, P. G., Bosiers, J. T., and Huinink, W. F., "The Double-Sided Floating-Surface detector: An enhanced Charge-Detection architecture for CCD image sensors", in [*Solid State Device Research Conference, 1995. ESSDERC '95. Proceedings of the 25th European]*, 327-330, IEEE (September 1995).

[29] Roks, E., Centen, P., Bosiers, J., and Huinink, W., "The Double-Sided Floating-Surface detector: An enhanced Charge-Detection architecture for CCD image sensors," Vol. 43, 1583-1591 (September 1996).

[30] Matsunaga, Y., Oosawa, S., Iesaka, M., Manabe, S., Harada, N., and Suzuki, N., "A high sensitivity output, amplifier for CCD image sensor", in [*Electron Devices Meeting,* 1987 International], 33, 116-119, IEEE (1987).

[31] Yamashita, H., Y., M., and Iesaka, M., "A New High Sensitivity Photo-transistor for Area Image Sensors", in [*Electron Devices Meeting,* 1988. IEDM '88. Technical Digest., International], 78-81 (December 1988).

[32] Wang, X., Snoeij, M. F., Rao, P. R., Mierop, A., and Theuwissen, A. J., "A CMOS image sensor with a Buried-Channel source follower", in [*Solid-State Circuits Conference,* 2008. *ISSCC* 2008. Digest of Technical Papers. IEEE International], 62-595, IEEE (February 2008).

[33] Chen, Y., Wang, X., Mierop, A. J., and Theuwissen, A. J., "A CMOS image sensor with In-Pixel Buried-Channel source follower and optimized row selector", *IEEE Transactions on Electron Devices* 56, 2390-2397 (November 2009).

The invention claimed is:

1. A semiconductor structure comprising
a semiconductor layer of a first conductivity type,
a photosensitive zone configured such that photogenerated charges may be accumulated in a first potential well;
a region of a second conductivity type, formed in the semiconductor layer, for temporarily storing the photogenerated charges in a second potential well;
a transfer gate between the region of the second conductivity type and the photosensitive zone for defining a potential barrier between the first and second potential wells during a non-transfer phase, and for eliminating the potential barrier between the first and second potential wells during a transfer phase; and
a readout structure for reading out the temporarily stored photogenerated charges, which comprises a JFET, the gate of which is formed by the region of the second conductivity type,
wherein the photosensitive zone is configured as a p-n photodiode which comprises a p-n junction, buried in the semiconductor layer, between a well of the second conductivity type, which is formed in the semiconductor layer, and a surrounding, adjoining portion of the semiconductor layer, and
wherein the well of the second conductivity type extends as far as below the transfer gate so as to there adjoin a well of the first conductivity type which comprises a higher doping concentration than that of the semiconductor layer, the region of the second conductivity type and the JFET being embedded in the well of the first conductivity type.

2. The semiconductor structure as claimed in claim 1, wherein the photosensitive zone is implemented as a photogate or buried photogate.

3. The semiconductor structure as claimed in claim 1, wherein the region of the second conductivity type is further coupleable to a supply potential terminal via a reset gate.

4. The semiconductor structure as claimed in claim 1, the semiconductor structure being implemented in CMOS.

5. The semiconductor structure as claimed in claim 1, wherein the photosensitive zone is linked to at least one collection gate which is adjoined by at least one transfer gate to which a region may be read out via a JFET structure.

6. The semiconductor structure as claimed in claim 1, wherein the photosensitive zone and/or a collection gate are connectable, via several transfer gates, to several regions which are linked at least partly to JFET readout structures.

7. The semiconductor structure as claimed in claim 1, wherein the well of the second conductivity type is covered, in the photosensitive zone, at a front side of the semiconductor layer by a layered semiconductor area of the first conductivity type which comprises a higher doping concentration than the semiconductor layer and the well of the second conductivity type, so that the first potential well is spaced apart from an insulating layer at the front side of the semiconductor layer, via which the transfer gate is insulated from the semiconductor layer.

8. The semiconductor structure as claimed in claim 1, wherein the region of the second conductivity type comprises a higher doping concentration than the well of the second conductivity type.

9. A semiconductor structure comprising
a semiconductor layer of a first conductivity type,
a photosensitive zone configured such that photogenerated charges may be accumulated in a first potential well;
a region of a second conductivity type, formed in the semiconductor layer, for temporarily storing the photogenerated charges in a second potential well;
a transfer gate between the region of the second conductivity type and the photosensitive zone for defining a potential barrier between the first and second potential wells during a non-transfer phase, and for eliminating the potential barrier between the first and second potential wells during a transfer phase; and
a readout structure for reading out the temporarily stored photo generated charges, which comprises a JFET, the gate of which is formed by the region of the second conductivity type,
wherein the JFET comprises a channel area of the first conductivity type which adjoins the region of the second conductivity type, is embedded in a further well of the second conductivity type, and comprises a drain terminal and a source terminal so as to form the JFET along with the region of the second conductivity type.

10. The semiconductor structure as claimed in claim 9, wherein the photosensitive zone is configured as a p-n photodiode which comprises a p-n junction, buried in the semiconductor layer, between a well of the second conductivity type, which is formed in the semiconductor layer, and a surrounding, adjoining portion of the semiconductor layer.

11. The semiconductor structure as claimed in claim 10, wherein the well of the second conductivity type is covered, in the photosensitive zone, at a front side of the semiconductor layer by a layered semiconductor area of the first conductivity type which comprises a higher doping concentration than the semiconductor layer and the well of the second conductivity type, so that the first potential well is spaced apart from an insulating layer at the front side of the semiconductor layer, via which the transfer gate is insulated from the semiconductor layer.

12. The semiconductor structure as claimed in claim 10, wherein the region of the second conductivity type comprises a higher doping concentration than the well of the second conductivity type.

13. The semiconductor structure as claimed in claim 9, wherein the channel area of the first conductivity type extends laterally to a drift current direction along which the photogenerated charges move from the first potential well into the second potential well during the transfer phase.

14. The semiconductor structure as claimed in claim 9, wherein the photosensitive zone is implemented as a photogate or buried photogate.

15. The semiconductor structure as claimed in claim 9, wherein the region of the second conductivity type is further coupleable to a supply potential terminal via a reset gate.

16. The semiconductor structure as claimed in claim 9, the semiconductor structure being implemented in CMOS.

17. The semiconductor structure as claimed in claim 9, wherein the photosensitive zone is linked to at least one collection gate which is adjoined by at least one transfer gate to which a region may be read out via a JFET structure.

18. The semiconductor structure as claimed in claim 9, wherein the photosensitive zone and/or a collection gate are connectable, via several transfer gates, to several regions which are linked at least partly to JFET readout structures.

* * * * *